United States Patent
Nagaso et al.

(10) Patent No.: US 9,438,301 B2
(45) Date of Patent: Sep. 6, 2016

(54) PLL CIRCUIT, CALIBRATION METHOD, AND WIRELESS COMMUNICATION APPARATUS

(71) Applicant: Panasonic Intellectual Property Management Co., Ltd., Osaka (JP)

(72) Inventors: Yoichi Nagaso, Osaka (JP); Kenji Miyanaga, Kanagawa (JP); Takahiro Shima, Kanagawa (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/409,239

(22) PCT Filed: Mar. 31, 2014

(86) PCT No.: PCT/JP2014/001897
§ 371 (c)(1),
(2) Date: Dec. 18, 2014

(87) PCT Pub. No.: WO2014/171086
PCT Pub. Date: Oct. 23, 2014

(65) Prior Publication Data
US 2016/0036485 A1  Feb. 4, 2016

(30) Foreign Application Priority Data
Apr. 19, 2013 (JP) ................. 2013-088849

(51) Int. Cl.
*H04B 1/06* (2006.01)
*H04B 7/00* (2006.01)
(Continued)

(52) U.S. Cl.
CPC .............. *H04B 1/403* (2013.01); *H03L 7/099* (2013.01); *H03L 7/183* (2013.01); *H04L 27/20* (2013.01); *H04L 27/22* (2013.01); *H03L 7/0995* (2013.01); *H03L 2207/06* (2013.01)

(58) Field of Classification Search
CPC .... H03L 2207/06; H03L 7/099; H04B 1/403
USPC ........................................................ 455/260
See application file for complete search history.

(56) References Cited

U.S. PATENT DOCUMENTS

| 4,347,484 A | 8/1982 | Vandegraaf |
| 7,557,664 B1 | 7/2009 | Wu |

(Continued)

FOREIGN PATENT DOCUMENTS

| JP | 57-25728 A | 2/1982 |
| JP | 2008-236557 A | 10/2008 |

(Continued)

OTHER PUBLICATIONS

International Search Report for Application No. PCT/JP2014/001897 dated May 20, 2014.

(Continued)

Primary Examiner — Eugene Yun
(74) Attorney, Agent, or Firm — Pearne & Gordon LLP

(57) ABSTRACT

In the stop state of a VCO and an injection locked frequency divider, an ILFD controller sets the control parameter of an injection locked frequency divider on the basis of the frequencies of a reference signal and the frequency-divided signal measured according to the control parameter of the injection locked frequency divider. While the injection locked frequency divider is operated and in the stop state of the VCO, the ILFD controller sets the control parameter of the injection locked frequency divider on the basis of the frequencies of the reference signal and the frequency-divided signal measured according to the control parameter of the injection locked frequency divider.

12 Claims, 18 Drawing Sheets

(51) Int. Cl.
  *H04B 1/403*  (2015.01)
  *H03L 7/183*  (2006.01)
  *H04L 27/20*  (2006.01)
  *H04L 27/22*  (2006.01)
  *H03L 7/099*  (2006.01)

(56) References Cited

U.S. PATENT DOCUMENTS

| | | |
|---|---|---|
| 7,856,212 B2 | 12/2010 | Pellerano et al. |
| 2008/0238495 A1 | 10/2008 | Tachibana et al. |
| 2009/0042528 A1 | 2/2009 | Pellerano et al. |
| 2013/0141146 A1 | 6/2013 | Shima |
| 2014/0120847 A1 | 5/2014 | Shima |

FOREIGN PATENT DOCUMENTS

| | | |
|---|---|---|
| WO | 2012/120795 A1 | 9/2012 |
| WO | 2013/140755 A1 | 9/2013 |

OTHER PUBLICATIONS

Takahiro Shima, "A 60GHz CMOS IC for a short-range wireless system—Injection Locked Frequency Divider", Proceedings of the 2011 IE ICE General Conference Electronics 2, Mar. 18, 2011 (received date), p. 91.

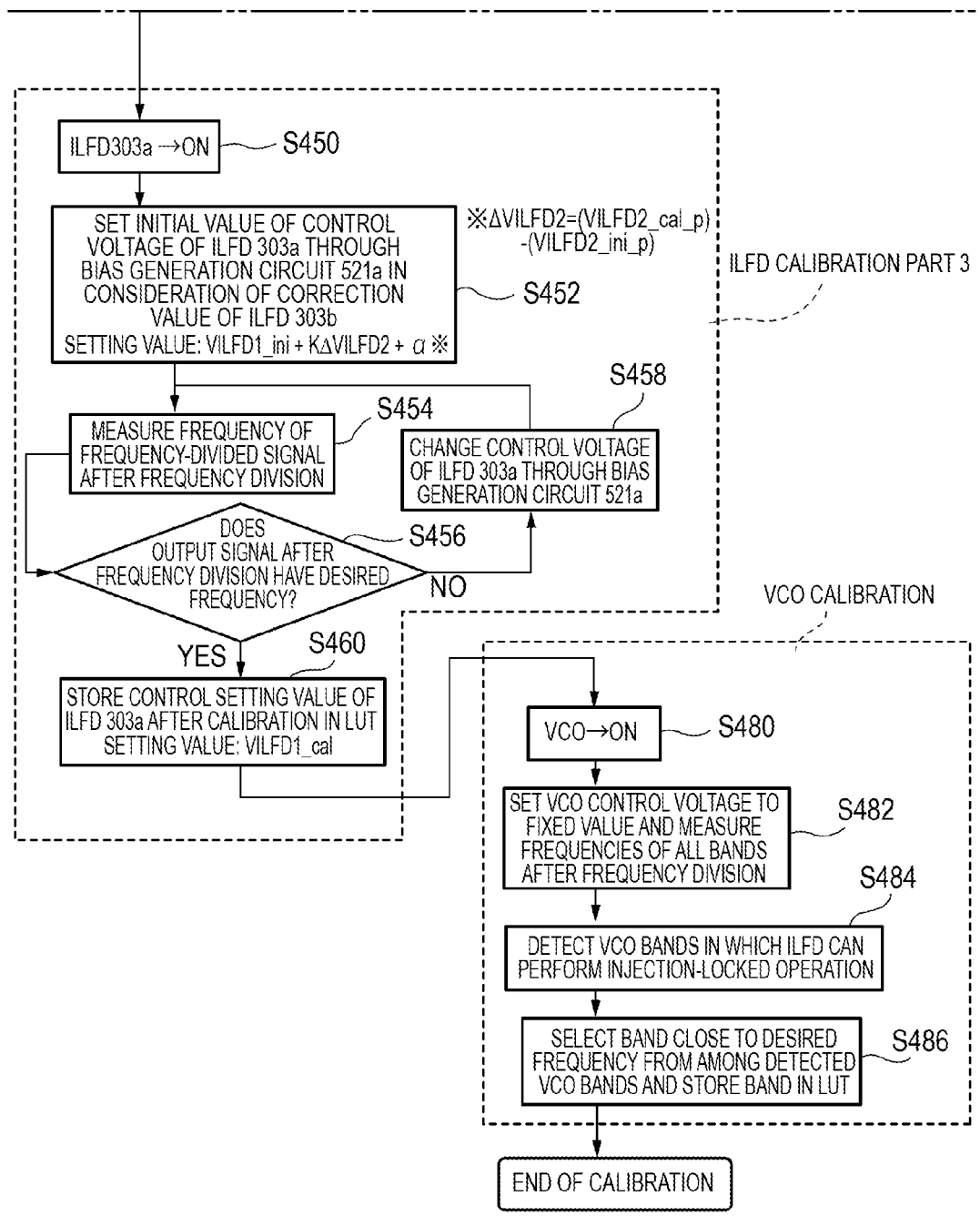

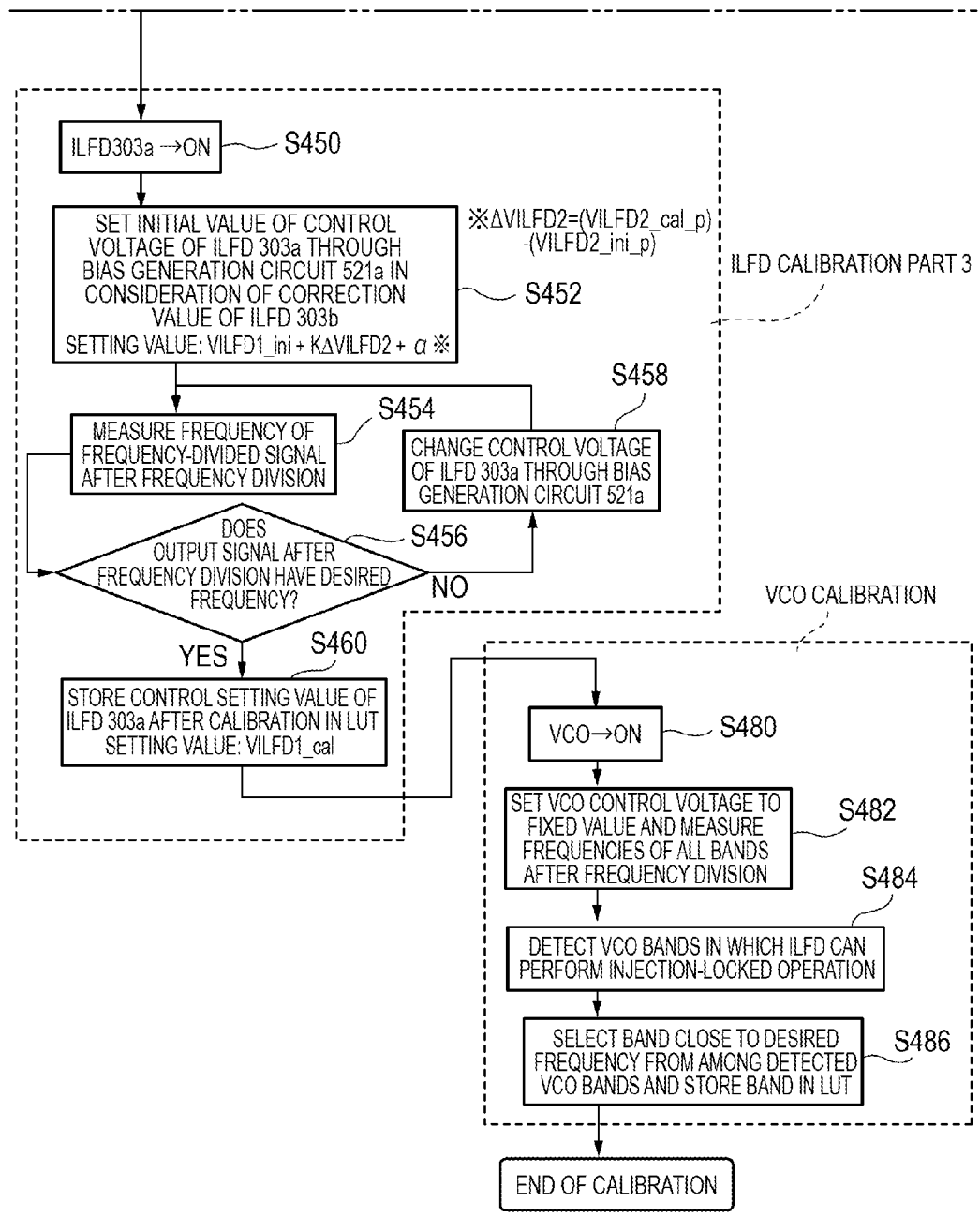

(A)

(B)

PLL CIRCUIT, CALIBRATION METHOD, AND WIRELESS COMMUNICATION APPARATUS

TECHNICAL FIELD

The present disclosure relates to a PLL circuit using a plurality of injection locked frequency dividers, a calibration method, and a wireless communication apparatus.

BACKGROUND ART

Mobile wireless communication apparatuses becoming widespread in recent years are required to have high throughput, and a PLL (Phase Locked Loop) circuit operating in a high-frequency band as a frequency synthesizer in wireless communications is requested to be used.

The PLL circuit includes a frequency divider for frequency-dividing a high-frequency signal into a low-frequency signal. An ILFD (Injection Locked Frequency Divider) capable of operating at high speed with low power consumption in a high-frequency band of 10 GHz or more for example is used as a frequency divider. The injection locked frequency divider is hereafter simply referred to as "ILFD" as necessary.

In the ILFD, a frequency band (hereafter referred to as "locking range") in which the ILFD operates as a frequency divider for frequency-dividing an injection signal (input signal) is narrow; hence, calibration in which the control voltage of the ILFD for changing the locking range according to the frequency of an injection signal is required so that the ILFD operates as a frequency divider in a high-frequency band (for example, a millimeter wave band) (for example, refer to Patent Document 1).

PRIOR ART DOCUMENT

Patent Document

Patent Document 1: U.S. Pat. No. 7,856,212

GENERAL DESCRIPTION OF THE INVENTION

Problem that the Invention is to Solve

It is effective to use a plurality of cascade-connected injection locked frequency dividers to raise the oscillation frequency of a voltage controlled oscillator (VCO) being used in a PLL circuit or to reduce the power consumption of the PLL circuit. The voltage controlled oscillator is hereafter simply referred to as "VCO" as necessary.

However, in Patent Document 1, there is a problem that the method for calibrating the PLL circuit including a plurality of cascade-connected injection locked frequency dividers is not specified.

To solve the above-mentioned conventional problem, the present disclosure is intended to provide a PLL circuit, a calibration method and a wireless communication apparatus capable of stably obtaining a desired frequency by operating a plurality of cascade-connected injection locked frequency dividers in their respective locking ranges.

Means for Solving the Problem

The present disclosure provides a PLL circuit including: a voltage controlled oscillator for outputting a high-frequency signal; a first injection locked frequency divider for generating a first frequency-divided signal obtained by frequency-dividing the output high-frequency signal; a second injection locked frequency divider for generating a second frequency-divided signal obtained by frequency-dividing the first frequency-divided signal; a frequency divider for generating a third frequency-divided signal obtained by frequency-dividing the second frequency-divided signal into the frequency of a reference signal; a phase and frequency detector for comparing the third frequency-divided signal with the reference signal and for outputting the errors in phase and frequency therebetween; a charge pump for converting the output errors into current or voltage; a loop filter for generating the control voltage of the voltage controlled oscillator according to the converted current or voltage and for applying the generated control voltage to the voltage controlled oscillator; and a calibration circuit for selecting an oscillation band for determining the oscillation frequency of the voltage controlled oscillator, for operating the first injection locked frequency divider and the second injection locked frequency divider at different operation bands, and for adjusting a first control parameter of the first injection locked frequency divider and a second control parameter of the second injection locked frequency divider, wherein after adjusting the second control parameter, the calibration circuit adjusts the first control parameter, and adjusts the oscillation band of the voltage controlled oscillator according to the third frequency-divided signal.

The present disclosure provides a calibration method in a PLL circuit in which a first injection locked frequency divider is connected to a second injection locked frequency divider, comprising the steps of stopping the operations of a voltage controlled oscillator for outputting a high-frequency signal and the first injection locked frequency divider; measuring the frequencies of a predetermined reference signal and the first frequency-divided signal output from a frequency divider for frequency-dividing the output signal of the second injection locked frequency divider according to the second control parameter of the second injection locked frequency divider; adjusting the second control parameter on the basis of the measured frequencies of the first frequency-divided signal and the reference signal; releasing the stop of the first injection locked frequency divider; measuring the frequencies of the predetermined reference signal and a second frequency-divided signal output from the frequency divider, the second frequency-divided signal being obtained by frequency-dividing the output signal of the first injection locked frequency divider by the second injection locked frequency divider according to the first control parameter of the first injection locked frequency divider and then by frequency-dividing the output signal of the second injection locked frequency divider by the frequency divider; adjusting the first control parameter on the basis of the measured frequencies of the second frequency-divided signal and the reference signal; releasing the stop of the voltage controlled oscillator; selecting an oscillation band for determining the oscillation frequency of the voltage controlled oscillator; and selecting the oscillation band of the voltage controlled oscillator on the basis of the frequencies of the predetermined reference signal and the frequency-divided signals obtained by frequency-dividing the output signal of the voltage controlled oscillator according to the selected oscillation band by the first injection locked frequency divider, by the second injection locked frequency divider and by the frequency divider.

The present disclosure provides a wireless communication apparatus comprising the PLL circuit; a modulator for modulating a baseband transmission signal; a transmission mixer for generating a high-frequency signal using the first local signal generated by the PLL circuit and the modulated transmission signal; a receiving mixer for generating a baseband reception signal using the second local signal generated by the PLL circuit and a received high-frequency reception signal; and a demodulator for demodulating the generated baseband reception signal.

Advantage of the Invention

With the present disclosure, a plurality of injection locked frequency dividers can operate in their locking ranges, and a desired frequency can be obtained.

MODE FOR CARRYING OUT THE INVENTION (Circumstances Leading to the Contents of Each Embodiment)

Figure 6:
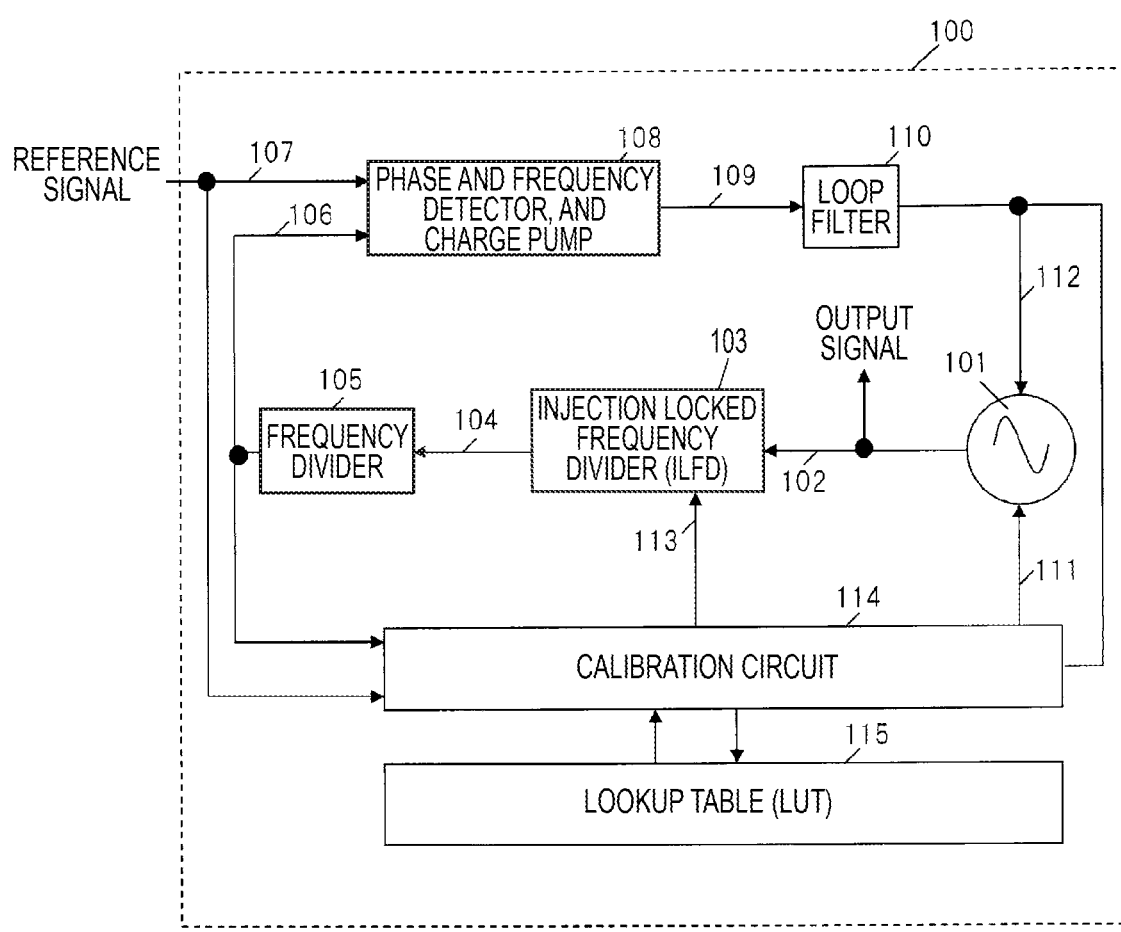
FIG. 6 is a block diagram showing an example of the circuit configuration of a conventional PLL circuit.

Before the description of a PLL circuit, a calibration method and a wireless communication apparatus according to each embodiment of the present disclosure, first, circumstances leading to the contents of each embodiment will be described referring to the drawings. FIG. 6 is a view showing an example of the circuit configuration of a conventional PLL circuit 100.

The PLL circuit 100 shown in FIG. 6 includes a voltage controlled oscillator (VCO) 101 for switching a plurality of oscillation bands, an injection locked frequency divider (ILFD) 103, a frequency divider 105, a phase and frequency detector+charge pump 108, a loop filter 110, a calibration circuit 114 and a lookup table 115.

In the PLL circuit 100 shown in FIG. 6, the output signal 102 generated by the oscillation of the VCO 101 is input to the ILFD 103 and is frequency-divided into a frequency signal 104 having a low frequency of approximately 10 GHz. The frequency signal 104 is frequency-divided into a frequency-divided signal 106.

The phase and frequency detector, and charge pump 108 compares the frequency-divided signal 106 frequency-divided by the frequency divider 105 with a reference signal 107 input from the outside of the PLL circuit 100 and converts the error components therebetween in phase and frequency into current or voltage 109. The current or voltage 109 is input to the loop filter 110. The loop filter 110 generates the control voltage 112 of the VCO 101 according to the current or voltage 109.

The control voltage 112 changes the oscillation frequency of the VCO 101, whereby the errors detected by the phase and frequency detector, and charge pump 108 can be reduced. Hence, the PLL circuit 100 can operate as a frequency negative feedback circuit for the oscillation frequency of the VCO 101.

The calibration circuit 114 adjusts (performs calibration) the control value of the control signal 113 of the ILFD 103 in the oscillation band of the VCO 101 using the reference signal 107 and the frequency-divided signal 106. By using the calibrated control signal 113, the ILFD 103 can set the locking range of the ILFD 103 near the center of the frequency range of the output signal 102 from the VCO 101.

Figure 7:
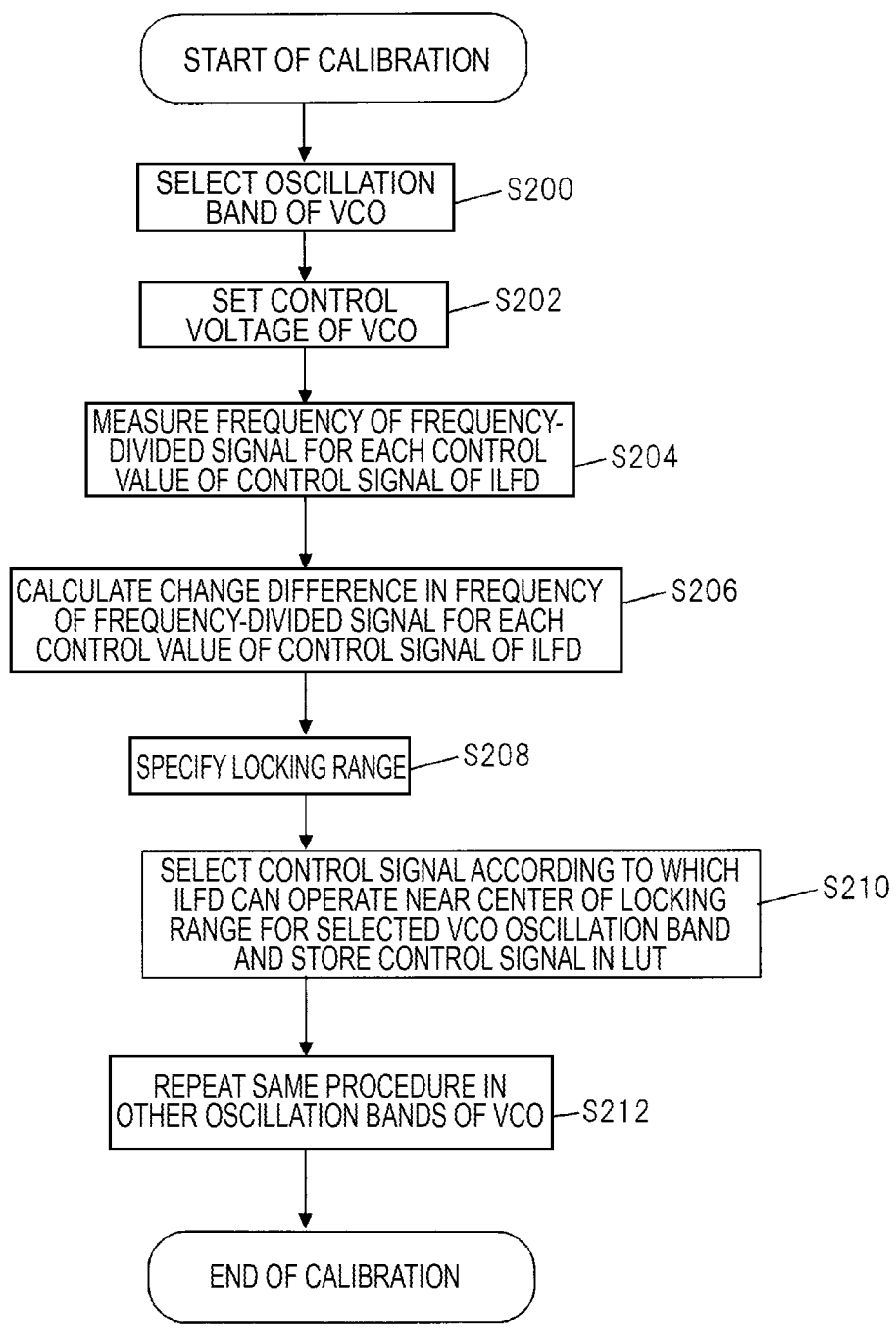
FIG. 7 is a flow chart illustrating an operation procedure for the calibration of the control voltage of the ILFD in the conventional PLL circuit.
Figure 8:
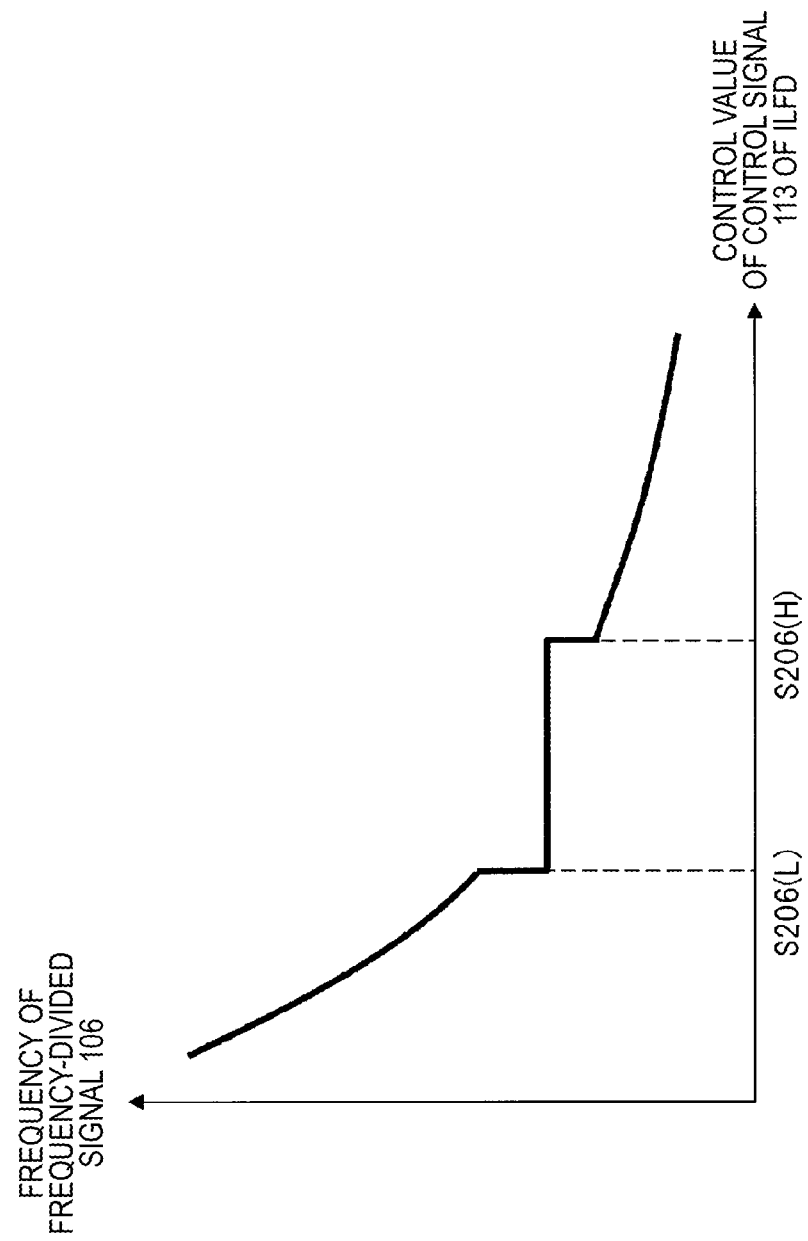
FIG. 8 is a view illustrating the processing for specifying the locking range of the ILFD in the conventional PLL circuit.

Next, an operation procedure for the calibration of the PLL circuit 100 shown in FIG. 6 will be described referring to FIGS. 7 and 8. FIG. 7 is a flow chart illustrating an operation procedure for the calibration of the control voltage of the ILFD 103 in the conventional PLL circuit 100. FIG. 8 is a view illustrating the processing for specifying the locking range of the ILFD 103 in the conventional PLL circuit 100. In FIG. 8, the horizontal axis represents the control value of the control signal 113 of the ILFD 103, and the vertical axis represents the frequency of the frequency-divided signal 106.

The calibration circuit 114 selects the oscillation band of the VCO 101 according to a band selection signal 111 (at S200). The band selection signal 111 is output from the calibration circuit 114.

The calibration circuit 114 sets the control signal 112 of the VCO 101 (at S202). For example, the calibration circuit 114 sets a predetermined value (for example, Vdd/2, Vdd: power source voltage) as the control voltage 112.

The calibration circuit 114 measures the frequency of the frequency-divided signal 106 for each control value of the control signal 113 of the ILFD 103 (at S204).

The calibration circuit 114 calculates the change difference in the frequency of the frequency-divided signal 106 for each control value of the control signal 113 of the ILFD 103 (at S206).

On the basis of the calculation result at step S206, the calibration circuit 114 specifies the locking range of the ILFD 103 for the oscillation band of the VCO 101 selected at step S200 (at step S208).

In the range of the control value of the control signal 113 from S206(L) to S206(H) shown in FIG. 8, the change difference in frequency calculated at step S206 is minimized. Hence, the calibration circuit 114 selects a value near the center value in the range of the control value of the control signal 113 from S206(L) to S206(H) as the control value of the control signal 113 of the ILFD 103 (at S210).

The calibration circuit 114 stores the control value of the control signal 113 selected at step S210 in the lookup table 115.

The calibration circuit 114 selects other oscillation bands of the VCO 101 and repeats the operation from step S202 to step S210 (at S212). Hence, the PLL circuit 100 can store the control value of the optimal control signal 113 of the ILFD 103 for each of the plurality of oscillation bands of the VCO 101.

During normal operation, the PLL circuit 100 first reads the control values stored in the lookup table 115 as the result of steps S210 and S212 and selects the band selection signal 111 of the VCO 101 being operable at a desired frequency and the control signal 113 of the ILFD 103. Hence, the PLL circuit 100 can operate as a frequency negative feedback circuit.

However, in the calibration method of the PLL circuit 100 according to Patent Document 1, in the case that a plurality of injection locked frequency dividers are cascade-connected, each time the control voltage of the injection locked frequency divider is changed, the calibration circuit 114 calculates the area in which the change difference in frequency is minimal and stores the result of the calculation in the lookup table 115. Consequently, the calibration time in the calibration circuit 114 becomes long, and the amount of information to be stored in the lookup table 115 increases.

Furthermore, in the ILFD 103, the characteristics of its output free-running frequency changes depending on fluctuation in the ambient temperature of the PLL circuit 100 or variation in production (see FIG. 17(A) or FIG. 17(B) described later); however, in Patent Document 1, the compensation for the fluctuation in the characteristics of the output free-running frequency due to fluctuation in ambient temperature or variation in production is not described in Patent Document 1.

Free-running operation is operation for outputting a self-oscillation frequency in the case that no input signal is present or operation for outputting the self-oscillation frequency even though an input frequency is input without being affected by the input frequency.

Hence, in each embodiment described below, examples of a PLL circuit, a calibration method and a wireless communication apparatus in which a plurality of cascade-connected injection locked frequency dividers are operated in their respective locking ranges to stably obtain a desired frequency in correspondence with fluctuation in ambient temperature or variation in production will be described.

Next, the injection locked frequency divider (ILFD) will be described.

Figure 9:
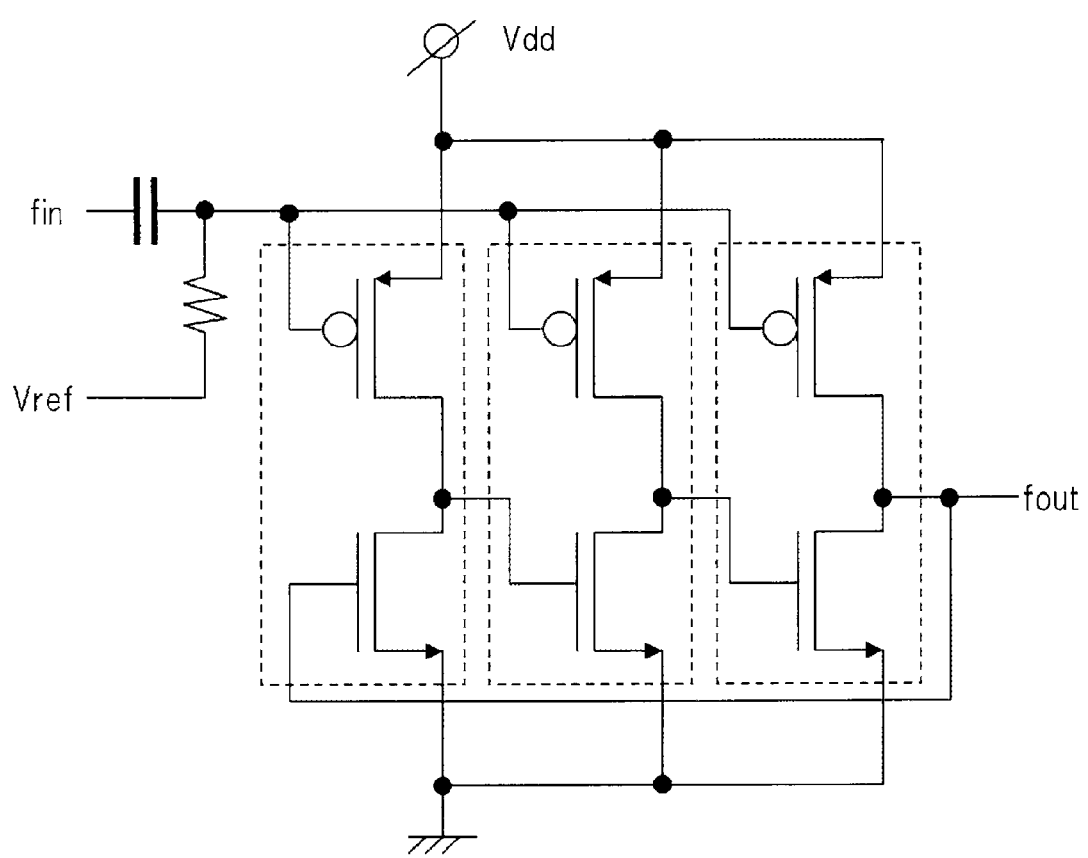
FIG. 9 is a view showing an example of the circuit configuration of the injection locked frequency divider.

FIG. 9 is a view showing an example of the circuit configuration of the injection locked frequency divider (ILFD) 103. The ILFD 103 shown in FIG. 9 has a configuration in which, for example, three sets of two cascode-connected transistors (see the broken lines shown in FIG. 9) are cascade-connected in three stages, and the power source voltage Vdd is supplied to each set of the transistors.

The ILFD 103 shown in FIG. 9 operates as a divide-by-3 frequency divider in the case that the frequency of the injection signal is in the locking range of the ILFD 103, and a relationship of fin/fout=3 is established between the input conversion free-running frequency fin of the injection signal at the signal input node and the output frequency fout of the output signal at the signal output node.

Although the ILFD 103 will be described below so as to have the circuit configuration shown in FIG. 9, the circuit configuration of the ILFD 103 is not limited to the circuit configuration shown in FIG. 9; furthermore, although the frequency division ratio of the ILFD 103 is set to "3", the frequency division ratio is not limited to "3".

Figure 10:
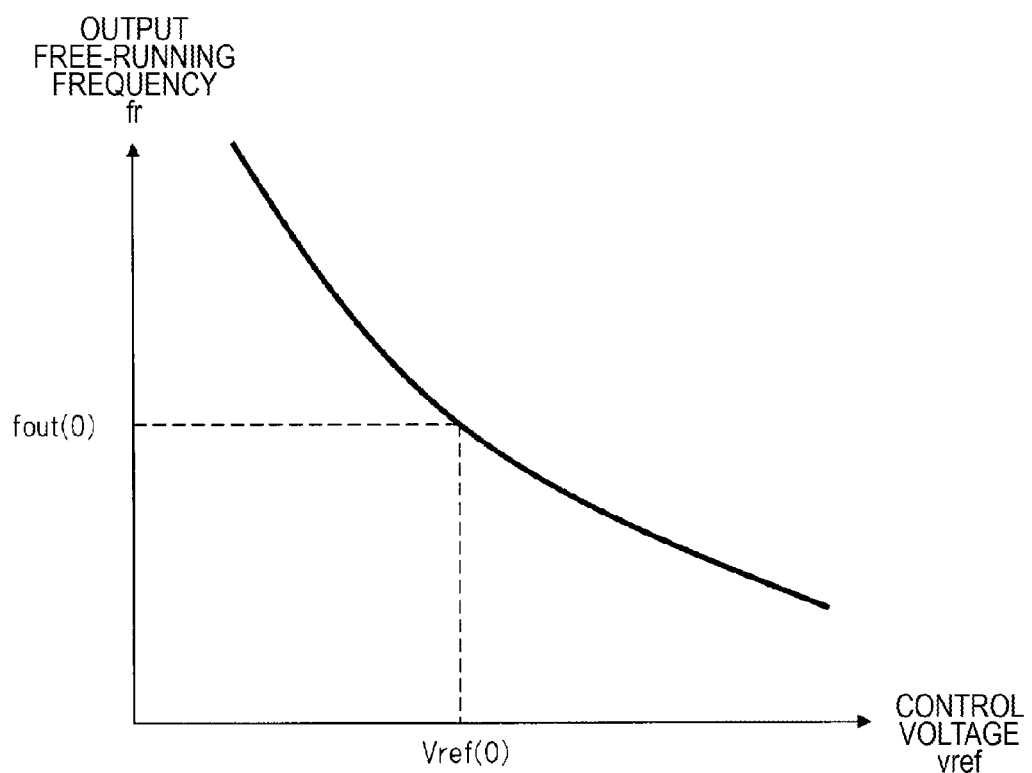
FIG. 10 is a graph showing an example of the relationship between a control voltage and an output free-running frequency in the case that no injection signal is input to the injection locked frequency divider.
Figure 11:
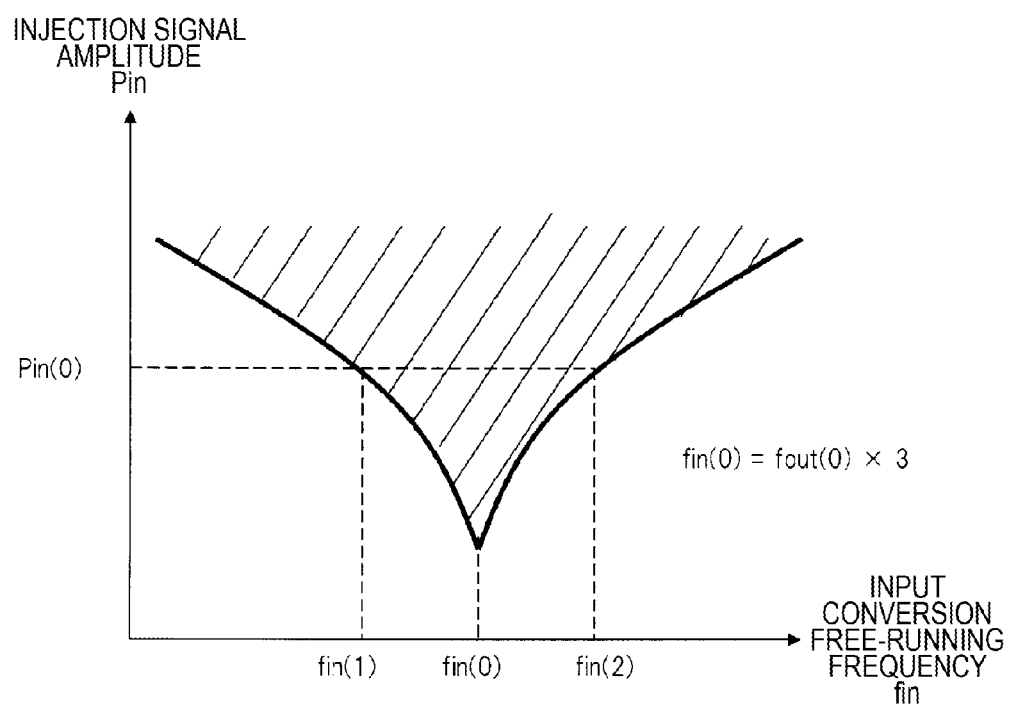
FIG. 11 is a graph showing an example of the input/output characteristics of the ILFD serving as a frequency divider in the case that a specific control voltage Vref(0) has been applied thereto.

In the case that no injection signal is input, the ILFD 103 performs free-running oscillation and outputs a signal having an output free-running frequency fr. FIG. 10 is a graph showing an example of the relationship between a control voltage Vref and the output free-running frequency fr in the case that no injection signal is input to the injection locked frequency divider 103. FIG. 11 is a graph showing an example of the input/output characteristics of the ILFD 103 serving as a frequency divider in the case that a specific control voltage Vref(0) has been applied thereto.

In FIG. 10, the horizontal axis represents the control voltage Vref of the ILFD 103, and the vertical axis represents the output free-running frequency fr of the ILFD 103. In FIG. 11, the horizontal axis represents the input conversion free-running frequency fin at the signal input node of the ILFD 103, and the vertical axis represents the injection signal amplitude Pin at the signal input node of the ILFD 103.

In the case that the input conversion free-running frequency fin and the injection signal amplitude Pin have values in the hatched range shown in FIG. 11, the ILFD 103 operates as a frequency divider for frequency-dividing the injection signal. In this embodiment, since the frequency division ratio is 3, the hatched range shown in FIG. 11 indicates the locking range of the ILFD 103. Hence, fin/fout=3 is established.

Even in the case that the injection signal amplitude Pin shown in FIG. 11 has the minimum value, the condition of the input conversion free-running frequency fin for operating the ILFD 103 as a frequency divider is fin(0)=fout(0)×3.

It is noted that fout(0) is the output free-running frequency at the signal input node in the case that the control voltage Vref(0) shown in FIG. 10 has been applied to the ILFD 103.

Hence, in the case that the injection signal amplitude is set to Pin(0) at the signal input node of the ILFD 103 in FIG. 11, the range of the input frequency for operating the ILFD 103 as a frequency divider is from fin(1) or more to fin(2) or less. It is noted that fin(0)=fout(0)×3.

Consequently, in the case that the output free-running frequency of the ILFD 103, that is, fout(0), is adjusted to a frequency (for example, fin(0)/3 shown in FIG. 11) near the desired frequency, the ILFD 103 can operate as a frequency divider for normally frequency-dividing the injection signal.

Figure 12:
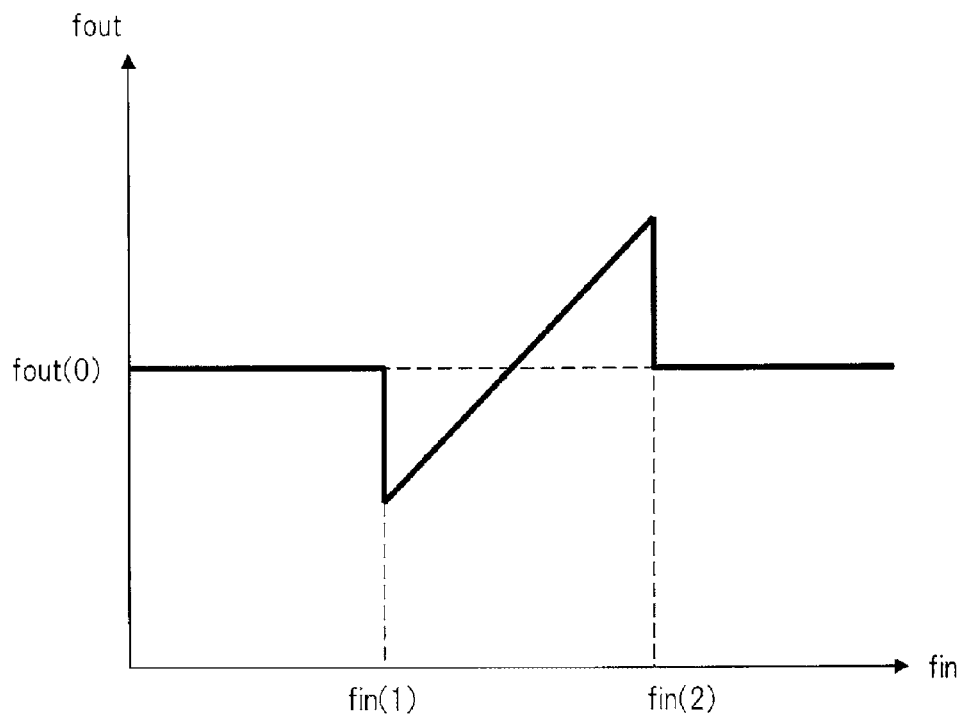
FIG. 12 is a graph showing an example of the relationship between the input frequency of an injection signal and an output frequency at a specific injection signal amplitude Pin(0)

FIG. 12 is a graph showing an example of the relationship between the input frequency of the injection signal and the output frequency at the specific injection signal amplitude Pin(0). In FIG. 12, the horizontal axis represents the input conversion free-running frequency fin at the signal input node of the ILFD 103, and the vertical axis represents the output frequency fout at the signal input node of the ILFD 103.

In the case that the injection signal amplitude is Pin(0) and that the input conversion free-running frequency fin is in the range from fin(1) or more to fin(2) or less, the ILFD 103 operates as a frequency divider (see FIG. 11), whereby the relationship of fin/fout=3 is established and expressed by a linear line (see FIG. 12). However, in the case that the input conversion free-running frequency fin is not in the range from fin(1) or more to fin(2) or less, the ILFD 103 outputs the signal having the frequency fout(0) near the output free-running frequency fr.

Figure 13:
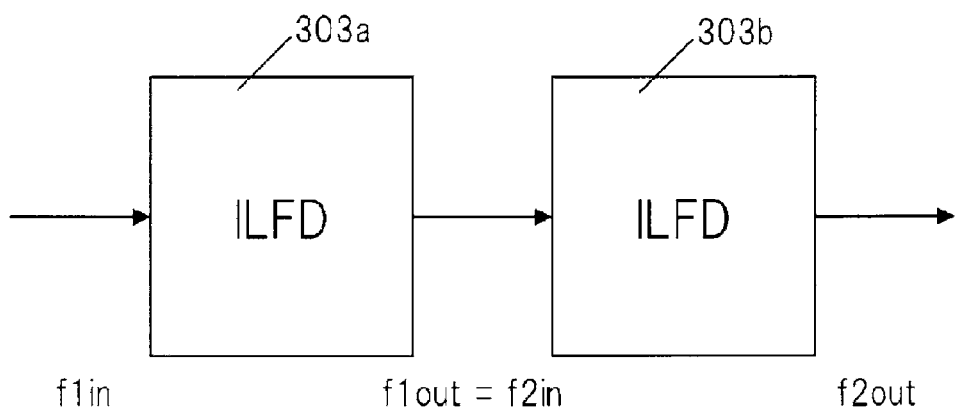
FIG. 13 is a view briefly showing an example of a circuit configuration in which a plurality (for example, 2) of injection locked frequency dividers are cascade-connected.
Figure 14:
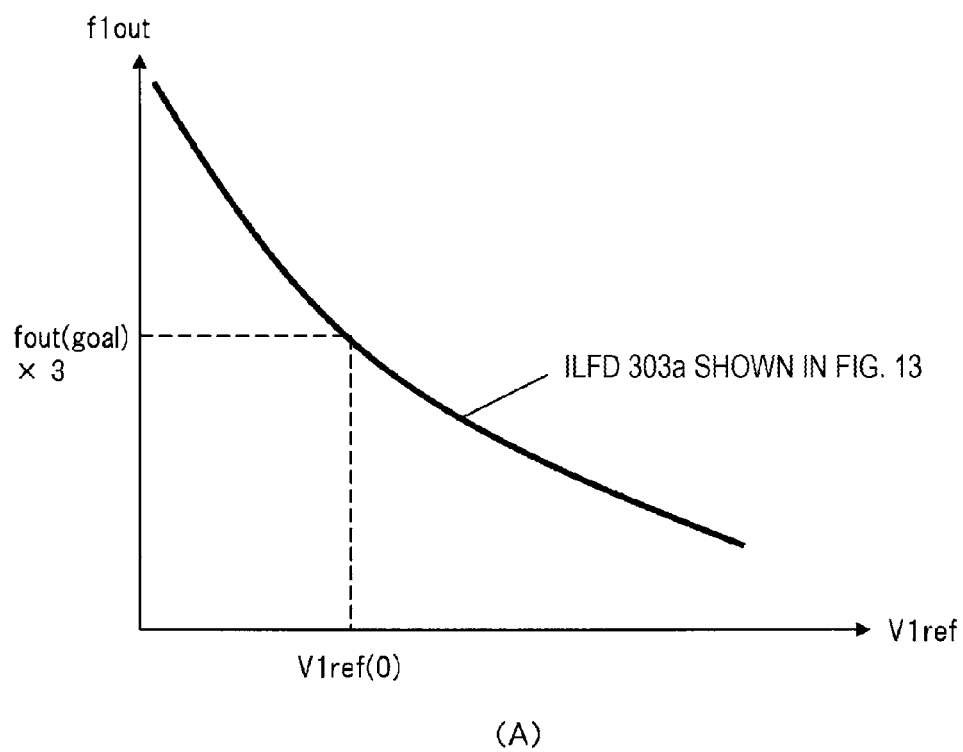
FIG. 14(A) is a graph showing an example of the relationship between the control voltage and the output free-running frequency in the pre-stage ILFD 303a shown in FIG. 13.
FIG. 14(B) is a graph showing an example of the relationship between the control voltage and the output free-running frequency in the post-stage ILFD 303b shown in FIG. 13.
Figure 14:
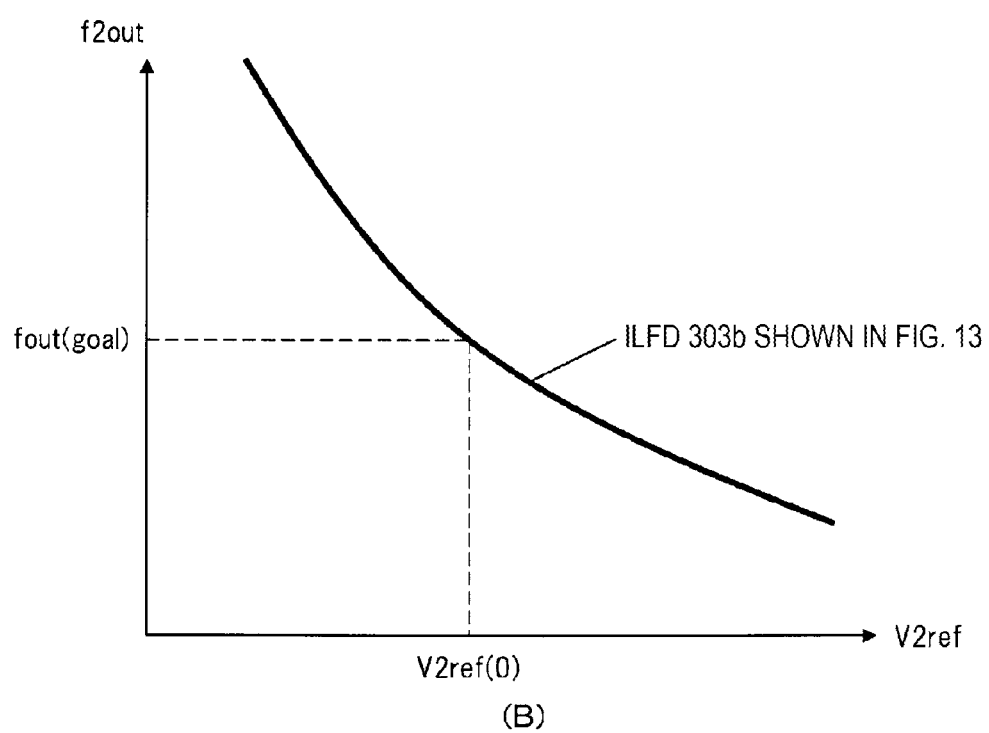
Figure 15:
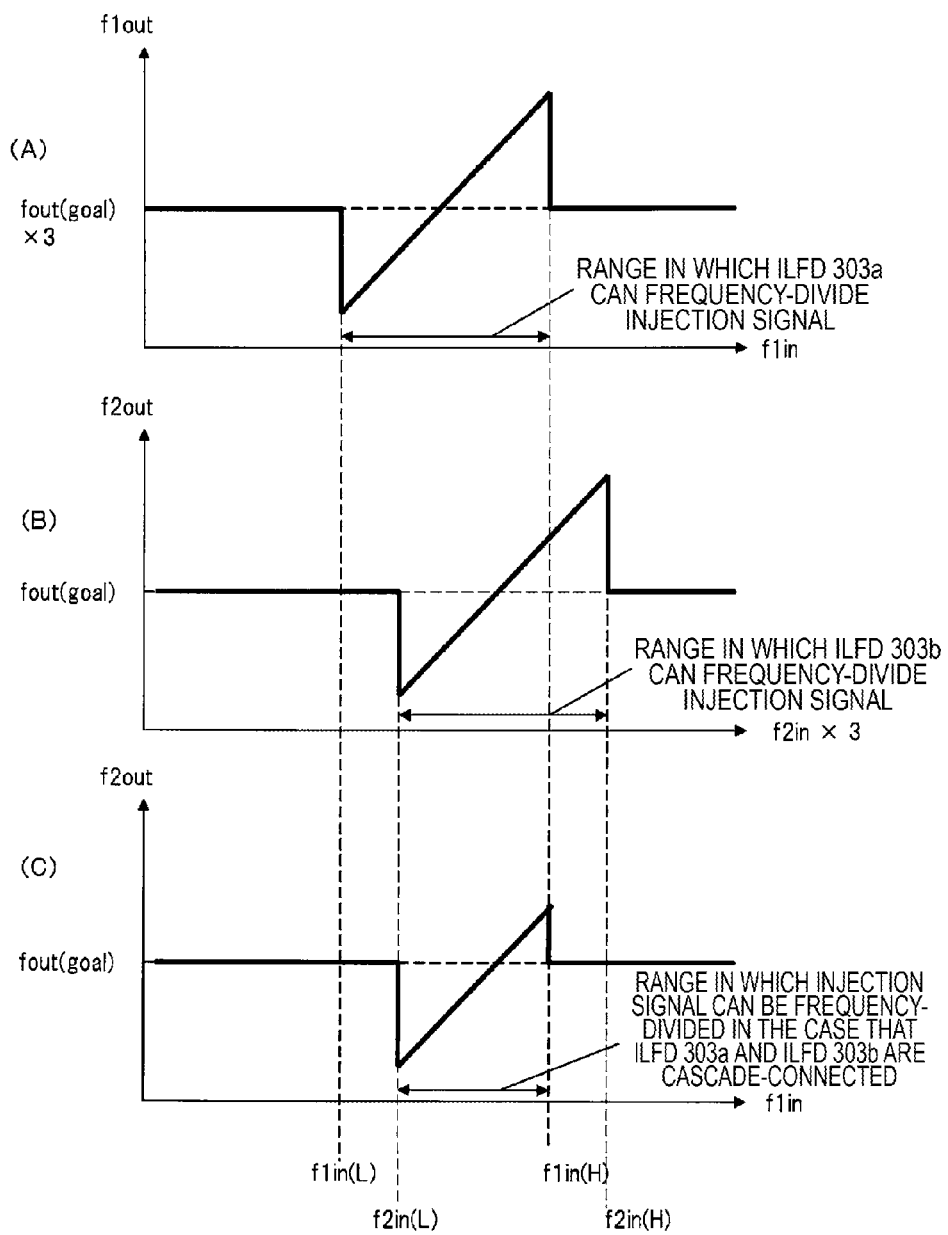
FIG. 15(A) is a graph showing an example of the relationship between the input frequency of the injection signal and the output frequency in the ILFD 303a shown in FIG. 13.
FIG. 15(B) is a graph showing an example of the relationship between the input frequency of the injection signal and the output frequency in the ILFD 303b shown in FIG. 13.
FIG. 15(C) is a graph showing an example of the relationship between the input frequency of the injection signal and the output frequency in the cascade-connected ILFDs 303a and 303b shown in FIG. 13.

Next, the characteristics in the case that the ILFDs having the circuit configuration shown in FIG. 9 are cascade-connected will be described referring to FIGS. 13 to 17. FIG. 13 is a view briefly showing an example of a circuit configuration in which a plurality (for example, 2) of injection locked frequency dividers are cascade-connected.

FIG. 13 shows a circuit configuration in which ILFDs 303a and 303b being used in each of the following embodiments are cascade-connected. The ILFDs 303a and 303b operate, for example, as divide-by-3 frequency dividers in the case that the frequency of the injection signal is in the range of each locking range. In the case that the ILFDs 303a and 303b operate as frequency dividers, they operate as frequency dividers for frequency-dividing the frequency of the injection signal to be input to the pre-stage ILFD 303a by 9.

Hence, in the case that the input conversion free-running frequency of the injection signal to be input to the pre-stage ILFD 303a is assumed to be fin(goal) and that the output frequency of the signal to be output from the post-stage ILFD 303b is assumed to be fout(goal), a relationship of fin(goal)/fout(goal)=9 is established.

For the purpose of describing the circuit behaviors of the ILFDs 303a and 303b cascade-connected as shown in FIG. 13, in the case that no injection signal is input to the ILFDs 303a and 303b, it is assumed that the single-unit free-running characteristics thereof are as described below.

FIG. 14(A) is a graph showing an example of the relationship between the control voltage V1ref and the output free-running frequency f1out in the pre-stage ILFD 303a shown in FIG. 13. FIG. 14(B) is a graph showing an example of the relationship between the control voltage V2ref and the output free-running frequency f2out in the post-stage ILFD 303b shown in FIG. 13.

In the case that no injection signal is input to the pre-stage ILFD 303a shown in FIG. 13 and in the case that the control voltage V1ref of the pre-stage ILFD 303a is set to V1ref(0), the output free-running frequency fr output from the pre-stage ILFD 303a becomes f1out=fout(goal)×3.

Similarly, in the case that no injection signal is input to the post-stage ILFD 303b shown in FIG. 13 and in the case that the control voltage V2ref of the post-stage ILFD 303b is set to V2ref(0), the output free-running frequency fr output from the post-stage ILFD 303b becomes f2out=fout(goal).

In the case that the ILFD 303a having the single-unit output free-running characteristics shown in FIG. 14(A) and the ILFD 303b having the single-unit output free-running characteristics shown in FIG. 14(B) are cascade-connected (see FIG. 13) and that no injection signal is input to the pre-stage ILFD 303a, the output free-running characteristics of the ILFDs 303a and 303b will be described.

In the case that the control voltage V1ref(0) is set in the pre-stage ILFD 303a and that the control voltage V2ref(0) is set in the post-stage ILFD 303b, the pre-stage ILFD 303a outputs a signal having a frequency of f1 out=fout(goal)×3 as its output free-running frequency. The frequency f1 out=f2in=fout(goal)×3 output from the pre-stage ILFD 303a is input to the post-stage ILFD 303b as an input conversion free-running frequency.

This indicates a state in which the input conversion free-running frequency, fin(0=fout(goal)×3, is input to the post-stage ILFD 303b in FIG. 11; the post-stage ILFD 303b is injection-locked with fin(0) serving as the input conversion free-running frequency, frequency-divides fin(0) serving as the input conversion free-running frequency by 3, and then outputs fout(goal) serving as its output free-running frequency.

In the case that the ILFDs 303a and 303b are cascade-connected, a control voltage for making f1out serving as the output free-running frequency output from the ILFD 303a equal to f2in serving as the input conversion free-running frequency of the injection signal to be input to the ILFD 303b is set in each of the ILFDs 303a and 303b. Hence, the input frequency of the injection signal input to the pre-stage ILFD 303a is frequency-divided by 9, and a signal having the divided output frequency is output from the post-stage ILFD 303b.

FIG. 15(A) is a graph showing an example of the relationship between the input frequency of the injection signal and the output frequency in the ILFD 303a shown in FIG. 13. FIG. 15(B) is a graph showing an example of the relationship between the input frequency of the injection signal and the output frequency in the ILFD 303b shown in FIG. 13. The horizontal axis of FIG. 15(B) is adjusted according to the magnitude of the input frequency of the injection signal of the ILFD 303a by multiplying the input frequency f2in of the injection signal of the ILFD 303b by the frequency division ratio 3.

In FIG. 15(A), since the range of the input frequency of the injection signal from f1in (L) or more to f1in (H) or less is the locking range of the ILFD 303a, the ILFD 303a can operate as a frequency divider. In FIG. 15(B), since the range of the input frequency of the injection signal from f2in (L) or more to f2in (H) or less is the locking range of the ILFD 303b, the ILFD 303b can operate as a frequency divider.

For ease of description, in FIG. 15(A) and FIG. 15(B), it is assumed that f1in (L)<f2in (L) and f1in (H)<f2in (H).

FIG. 15(C) is a graph showing an example of the relationship between the input frequency of the injection signal and the output frequency in the cascade-connected ILFDs 303a and 303b shown in FIG. 13. In FIG. 15(C), since the range of the input frequency of the injection signal from f2in (L) or more to f1in (H) or less is the locking range common to both the ILFDs 303a and 303b, the ILFDs 303a and 303b can operate as frequency dividers.

The operations of the above-mentioned cascade-connected ILFDs 303a and 303b have been described in the case that the respective control voltages of the ILFDs 303a and 303b are fixed; the PLL circuit requires operation (calibration) for adjusting the respective control voltages so that the desired input conversion free-running frequency fin(goal) of the injection signal is frequency-divided by the ILFD 303a and so that the frequency-divided signal after the frequency division by the ILFD 303a is further frequency-divided by the ILFD 303b.

Figure 16:
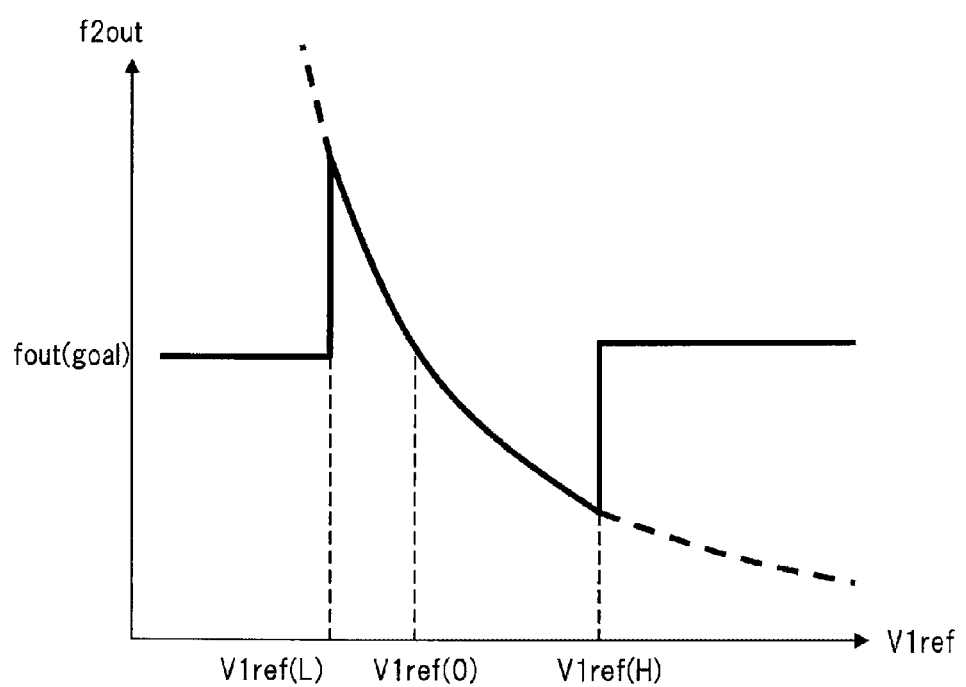
FIG. 16 is a graph showing an example of the relationship between the control voltage V1ref of the ILFD 303a and the output free-running frequency f2out of the ILFD 303b in the cascade-connected ILFDs 303a and 303b shown in FIG. 13.

FIG. 16 is a graph showing an example of the relationship between the control voltage V1ref of the ILFD 303a and the output free-running frequency f2out of the ILFD 303b in the cascade-connected ILFDs 303a and 303b shown in FIG. 13.

In FIG. 16, the horizontal axis represents the control voltage V1ref of the pre-stage ILFD 303a, and the vertical axis represents the output free-running frequency f2out of the post-stage ILFD 303b, the control voltage of the post-stage ILFD 303b is V2ref(0), and the post-stage ILFD 303b satisfies the input/output characteristics of the free-running frequency shown in FIG. 14(B).

In FIG. 16, in the case that the control voltage of the ILFD 303a is in the ranges of V1ref<V1ref(L) and V1ref(H)<V1ref, the ILFD 303b does not operate as a frequency divider, whereby the output free-running frequency fout (goal) of the ILFD 303b is output. On the other hand, in the case that the control voltage of the ILFD 303a is in the range of V1ref(L)<V1ref(0)<V1ref(H), the ILFDs 303a and 303b operate as frequency dividers.

As described above, in the calibration in the PLL circuit including the plurality of cascade-connected ILFDs, the PLL circuit is required to operate the output free-running frequency signal output from the pre-stage ILFD in the locking range of the post-stage ILFD.

Furthermore, allowance for variation in production and the maintenance of the characteristics of the PLL circuit after calibration are exemplified as properties requested for the PLL circuit requiring calibration.

Figure 17:
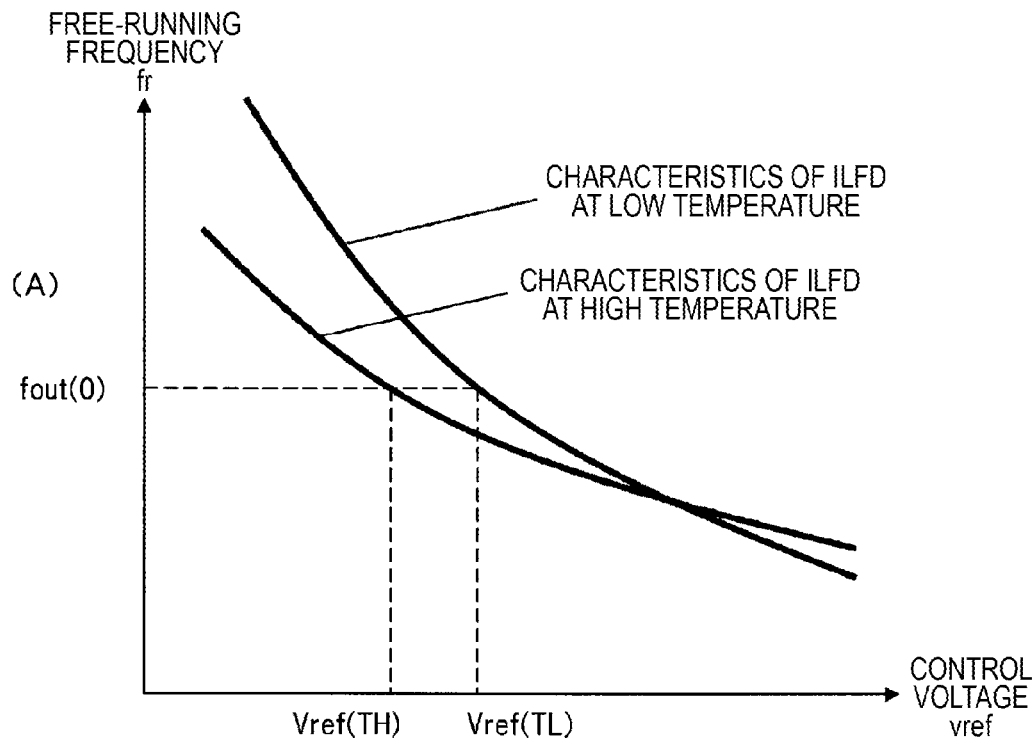
FIG. 17(A) is a graph showing an example of the characteristics of the control voltage and the output free-running frequency affected by fluctuation in temperature.
FIG. 17(B) is a graph showing an example of the characteristics of the control voltage and the output free-running frequency affected by variation in production.
Figure 17:
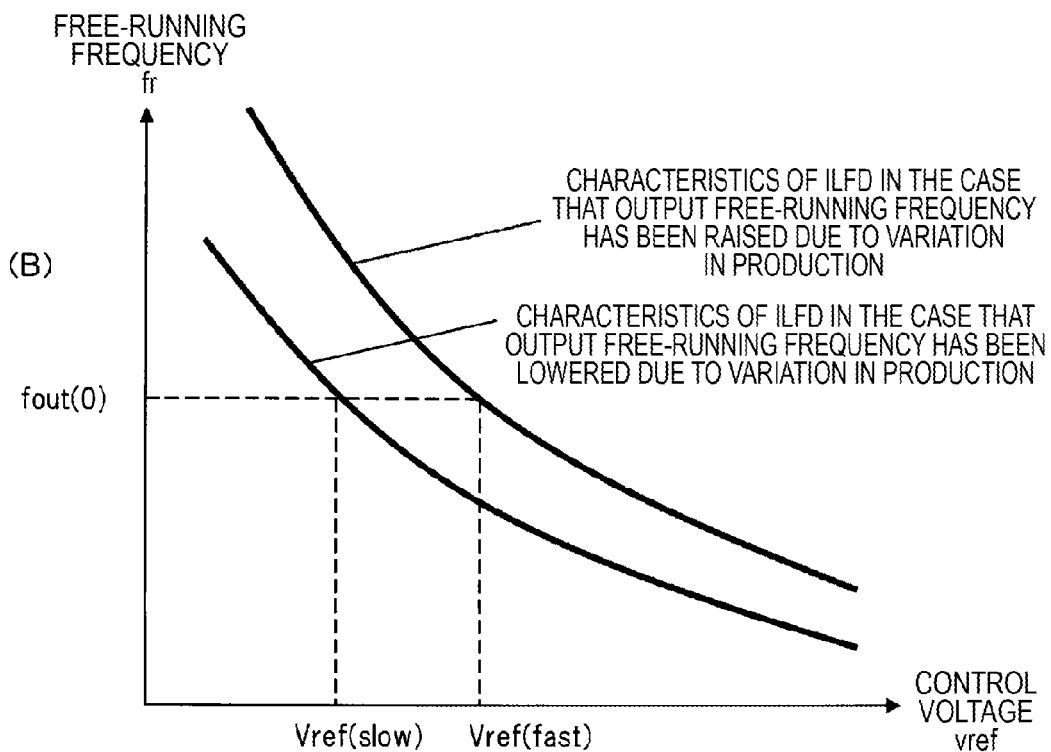

Next, fluctuation in the output free-running characteristics of a single ILFD shown in FIG. 10 will be described referring to FIG. 17 by taking the ILFD having the circuit configuration shown in FIG. 9 as an example. Factors affecting the fluctuation in the output free-running characteristics of the ILFD include, for example, fluctuation in temperature and variation in production.

FIG. 17(A) is a graph showing an example of the characteristics of the control voltage Vref and the output free-running frequency fr affected by fluctuation in temperature. FIG. 17(B) is a graph showing an example of the characteristics of the control voltage Vref and the output free-running frequency fr affected by variation in production.

It is herein assumed that the upper limit of the ambient temperature serving as a circuit operation specification is TH and that the lower limit of the ambient temperature is TL.

In FIG. 17(A), the control voltage Vref at which the output free-running frequency fout(0) of the ILFD is obtained is Vref(TH) in the case that the ambient temperature has the upper limit value and is Vref(TL) in the case that the ambient temperature has the lower limit value. Since the ILFD has a narrow locking range, the control voltage is desired to be adjusted to the control voltage Vref at which the output free-running frequency fout(0) is obtained in the range of the ambient temperature serving as the circuit operation specification, that is, in the range of the ambient temperature from TL to TH.

In FIG. 17(B), the control voltage Vref at which the output free-running frequency fout(0) of the ILFD is obtained is Vref(fast) in the case that the output free-running frequency becomes high due to the influence of variation in production, and is Vref(slow) in the case that the output free-running frequency becomes low due to the influence of variation in production. Fluctuation in the threshold values of transistors is typically exemplified as variation in production. Since variation in production is a characteristic parameter inherent in each integrated circuit, once the control voltage is calibrated, the free-running characteristics of the ILFD do not change with time.

In the calibration in the PLL circuit, both fluctuation in temperature and variation in production are required to be considered; however, since ambient temperature changes with time, the control voltage is required to be calibrated intermittently in the case of the PLL circuit operating for a long time.

The influence of fluctuation in ambient temperature can be relieved by using a bias circuit following Vref(TH) in the case that the ambient temperature is high and by using a bias circuit following Vref(TL) in the case that the ambient temperature is low.

First Embodiment

Various embodiments of a PLL circuit according to the present disclosure will be described referring to the drawings. In addition, the present disclosure includes an operation procedure (steps) for the calibration in the PLL circuit as a calibration method and also includes a wireless communication apparatus including the PLL circuit as a local signal source.

Figure 1:
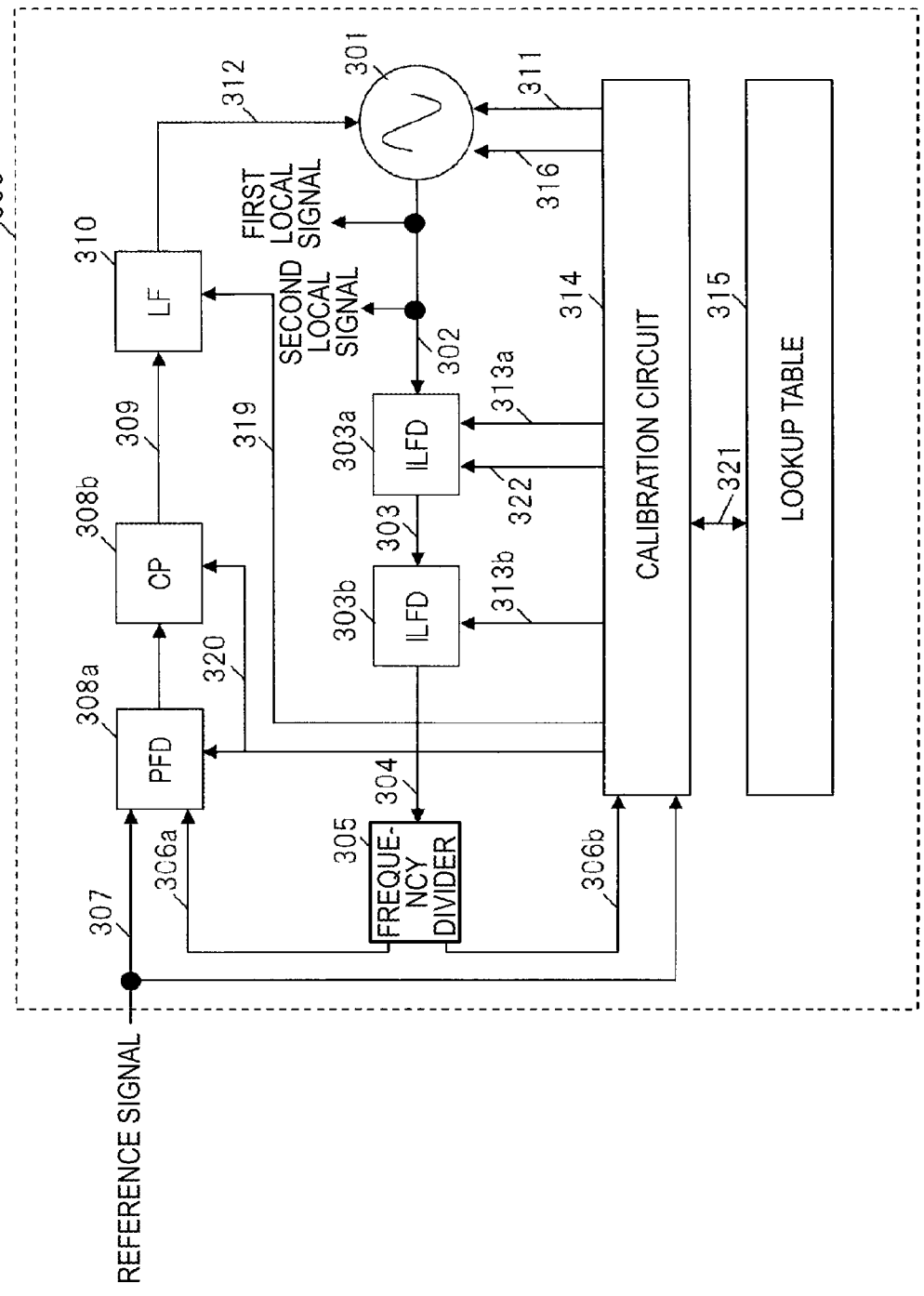
FIG. 1 is a block diagram showing the internal configuration of a PLL circuit according to a first embodiment.

FIG. 1 is a block diagram showing the internal configuration of a PLL circuit 300 according to a first embodiment. The PLL circuit 300 shown in FIG. 1 includes a voltage controlled oscillator (VCO) 301, a pre-stage injection locked frequency divider (ILFD) 303a, a post-stage injection locked frequency divider (ILFD) 303b, a frequency divider 305, a phase and frequency detector (PFD) 308a, a charge pump (CP) 308b, a loop filter (LF) 310, a calibration circuit 314, and a lookup table 315.

In the PLL circuit 300 shown in FIG. 1, although the phase and frequency detector 308a and the charge pump 308b are separately configured, they may be integrally configured.

The VCO 301 starts operating as a voltage controlled oscillator or stops operating as a voltage controlled oscillator according to the VCO on/off signal 316 generated by the calibration circuit 314. For example, in the case that the VCO on/off signal 316 is a signal for "turning on the VCO 301", the VCO 301 starts operating as a voltage controlled oscillator according to the VCO on/off signal 316. For example, in the case that the VCO on/off signal 316 is a signal for "turning off the VCO 301", the VCO 301 stops operating as a voltage controlled oscillator according to the VCO on/off signal 316.

While operating as a voltage controlled oscillator, the VCO 301 oscillates according to the control voltage 312 generated by the loop filter 310 and the oscillation frequency characteristics based on the oscillation band selected according to a band selection signal 311 described later.

The VCO 301 generates a high-frequency output signal 302 by oscillation and outputs the signal to the pre-stage ILFD 303a. The high-frequency output signal 302 is input to a transmission mixer 50a and a receiving mixer 50b as a first local signal and a second local signal shown in FIG. 3.

The pre-stage ILFD 303a corresponds to the ILFD 303a shown in FIG. 13 and is injection-locked with the high-frequency output signal 302 (injection signal) generated by the VCO 301 according to a control parameter (for example, a control voltage 313a) generated by the calibration circuit 314 and operates as a frequency divider, thereby frequency-dividing the high-frequency output signal 302 up to a predetermined number of times. The pre-stage ILFD 303a outputs the frequency-divided signal 303 obtained after the frequency division to the post-stage ILFD 303b.

The control parameter (the control voltage 313a) represents a control voltage for making the pre-stage ILFD 303a injection-locked with the high-frequency output signal 302 (injection signal) generated by the VCO 301 and for making the pre-stage ILFD 303a operate as a frequency divider.

The post-stage ILFD 303b corresponds to the ILFD 303b shown in FIG. 13 and is injection-locked with the frequency-divided signal 303 (injection signal) after the frequency division in the pre-stage ILFD 303a according to a control parameter (for example, a control voltage 313b) generated by the calibration circuit 314 and operates as a frequency divider, thereby frequency-dividing the frequency-divided signal 303 up to a predetermined number of times. The post-stage ILFD 303b outputs the frequency-divided signal 304 obtained after the frequency division to the frequency divider 305.

The control parameter (the control voltage 313b) represents a control voltage for making the post-stage ILFD 303b injection-locked with the frequency-divided signal 303 obtained after the frequency division in the pre-stage ILFD 303a and for making the post-stage ILFD 303b operate as a frequency divider.

The frequency divider 305 frequency-divides the frequency-divided signal 304 obtained after the frequency division in the post-stage ILFD 303b up to a predetermined number of times, outputs the frequency-divided signal 306a obtained after the frequency division to the phase and frequency detector (PFD) 308a, and outputs the frequency-divided signal 306b obtained after the frequency division to the calibration circuit 314. It is assumed that a constant frequency division ratio (for example, frequency division ratio=1) is established between the frequency-divided signal 306a and the frequency-divided signal 306b.

Figure 3:
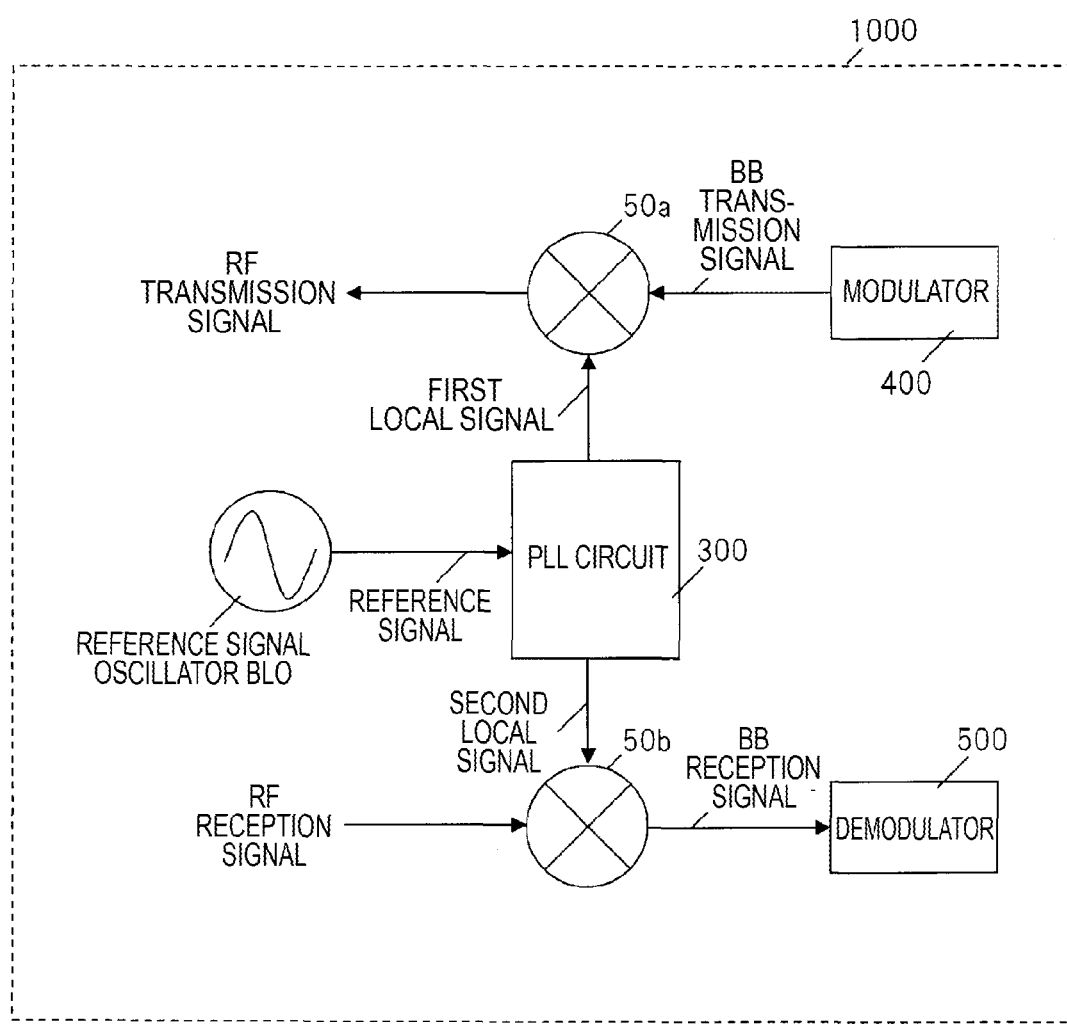
FIG. 3 is a block diagram showing the internal configuration of a wireless communication apparatus including the PLL circuit according to the first embodiment.

The phase and frequency detector 308a compares the frequency-divided signal 306a obtained after the frequency division in the frequency divider 305 with a reference signal 307 generated by a reference signal oscillator BLO shown in FIG. 3. The phase and frequency detector 308a generates the error components in phase and frequency between the frequency-divided signal 306a and the reference signal 307 and outputs the error components to the charge pump 308b.

The charge pump 308b converts the error components in phase and frequency generated by the phase and frequency detector 308a into current or voltage 309, thereby generating the current or voltage 309, and then outputs the current or voltage to the loop filter 310.

The loop filter 310 generates the control voltage 312 of the VCO 301 according to the current or voltage 309 generated by the charge pump 308b. The loop filter 310 outputs and applies the control voltage 312 to the VCO 301.

Figure 2:
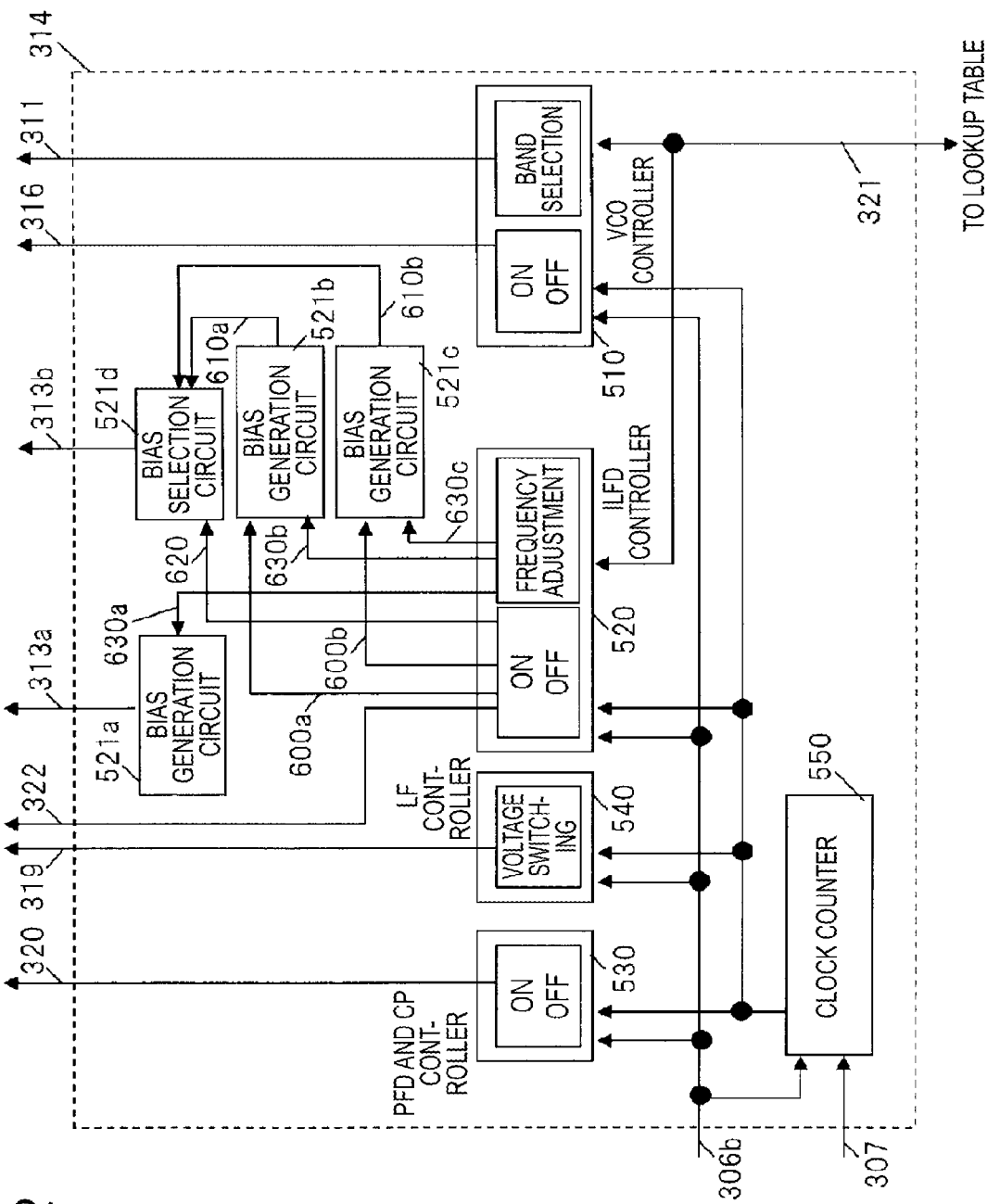
FIG. 2 is a block diagram showing the internal configuration of the calibration circuit in the PLL circuit according to the first embodiment.

The detailed configuration of the calibration circuit 314 will be described using FIG. 2. FIG. 2 is a block diagram showing the internal configuration of the calibration circuit 314 in the PLL circuit 300 according to the first embodiment.

The calibration circuit 314 shown in FIG. 2 includes a VCO controller 510, an ILFD controller 520, a PFD-CP controller 530, an LF controller 540, a bias generation circuit 521a, a bias generation circuit 521b, a bias generation circuit 521c, a bias selection circuit 521d, and a clock counter 550. The reference signal 307 is input to each section of the calibration circuit 314, whereby each section operates on the basis of the reference signal 307.

The VCO controller 510 controls the start (on) or stop (off) of the operation of the VCO 301. To turn on the operation of the VCO 301, the VCO controller 510 generates the VCO on/off signal 316 for turning on the operation of the VCO 301 and outputs the signal to the VCO 301. To turn off the operation of the VCO 301, the VCO controller 510 generates the VCO on/off signal 316 for turning off the operation of the VCO 301 and outputs the signal to the VCO 301.

While the VCO 301 operates, the VCO controller 510 outputs the band selection signal 311 for selecting the oscillation band of the VCO 301 to the VCO 301. The oscillation band is determined by the oscillation frequency characteristics of the VCO 301 according to the control voltage 312. The VCO controller 510 stores the selected oscillation band (the same as the content of the band selection signal 311) of the VCO 301 in the lookup table 315 via a control line 321.

The ILFD controller 520 controls the start (on) or stop (off) of the operation of the pre-stage ILFD 303a. To turn on the operation of the pre-stage ILFD 303a, the ILFD controller 520 generates an ILFD on/off signal 322 for turning on the operation of the pre-stage ILFD 303a and outputs the signal to the pre-stage ILFD 303a. To turn off the operation of the pre-stage ILFD 303a, the ILFD controller 520 generates the ILFD on/off signal 322 for turning off the operation of the pre-stage ILFD 303a and outputs the signal to the pre-stage ILFD 303a.

By supplying a control parameter 630a to the bias generation circuit 521a, the ILFD controller 520 causes the bias generation circuit 521a to generate the control parameter (for example, the control voltage 313a) of the pre-stage ILFD 303a and stores the control parameter 630a in the lookup table 315 via the control line 321.

Even in the case that the fluctuation in ambient temperature shown in FIG. 17(A) has occurred according to the control parameter 630a, the bias generation circuit 521a generates the control parameter (for example, the control voltage 313a) by which the pre-stage ILFD 303a can maintain its output free-running frequency constant or can reduce the fluctuation in the output free-running frequency, and the bias generation circuit 521a outputs and applies the control parameter to the pre-stage ILFD 303a.

By supplying a control parameter 630b having a constant value to the bias generation circuit 521b, the ILFD controller 520 causes the bias generation circuit 521b to generate a control parameter of the post-stage ILFD 303b.

By supplying a control parameter 630c having a constant value to the bias generation circuit 521c, the ILFD controller 520 causes the bias generation circuit 521c to generate a control parameter of the post-stage ILFD 303b.

The ILFD controller 520 generates a selection signal 620 for selecting the output of the bias generation circuit 521b or the output of the bias generation circuit 521c as the control parameter to be output and applied to the post-stage ILFD 303b and causes the bias selection circuit 521d to select the control parameter (for example, the control voltage 313b) of the post-stage ILFD 303b.

According to the selection signal 620 generated by the ILFD controller 520, the bias selection circuit 521d selects the control voltage 610a generated by the bias generation circuit 521b or the control voltage 610b generated by the bias generation circuit 521c, and outputs and applies the selected control voltage 610a or the selected control voltage 610b as the control voltage 313b to the post-stage ILFD 303b.

Even in the case that the fluctuation in ambient temperature shown in FIG. 17(A) or the variation in production shown in FIG. 17(B) has occurred for the control parameter 630b having a constant value, the bias generation circuit 521b generates the control parameter having a constant value (for example, the control voltage 610a) and outputs the control parameter to the bias selection circuit 521d.

Even in the case that the fluctuation in the ambient temperature shown in FIG. 17(A) or FIG. 17(B) has occurred for the control parameter 630c having a constant value, the bias generation circuit 521c generates the control parameter (for example, the control voltage 610b) by which the post-stage ILFD 303b can maintain its output free-running frequency constant or can reduce the fluctuation in the output free-running frequency, and the bias generation circuit 521c outputs the control parameter to the bias selection circuit 521d.

Furthermore, the ILFD controller 520 stores the control parameter 630a of the bias generation circuit 521a, the control parameter 630b of the bias generation circuit 521b and the control parameter 630c of the bias generation circuit 521c in the lookup table 315 via the control line 321.

Moreover, the ILFD controller 520 reads the initial values of the respective control parameters (for example, the control voltages) for adjusting the output free-running frequencies of the ILFDs 303a and 303b, and outputs the initial values to the bias generation circuits 521a, 521b and 521c.

According to the measurement result of the clock counter 550, the ILFD controller 520 changes the control parameters 630a, 630b and 630c for adjusting the output free-running frequencies of the frequency-divided signals after the frequency division by the ILFDs 303a and 303b to the desired frequencies. The ILFD controller 520 outputs the control parameters obtained after the change to the bias generation circuits 521a, 521b and 521c.

The initial values of the control parameters 630a, 630b and 630c and the band selection signal 311 of the VCO 301 and the control setting values thereof after calibration are stored in the lookup table 315. The initial values and the control setting values of the respective control parameters are, for example, setting values for setting the output free-running frequencies of the ILFDs 303a and 303b to the desired frequencies.

On the basis of the control parameters 630a, 630b and 630c generated by the ILFD controller 520, the bias generation circuits 521a, 521b and 521c convert the control parameters into the control voltages for adjusting the output free-running frequencies of the pre-stage ILFD 303a and the post-stage ILFD 303b or the frequencies of the frequency-divided signals. The bias generation circuits 521a, 521b and 521c output and apply the control voltages 313a and 313b to the pre-stage ILFD 303a and the post-stage ILFD 303b.

The PFD-CP controller 530 controls the start (on) or stop (off) of the operation of the phase and frequency detector 308a and the charge pump 308b. To turn on the operation of the phase and frequency detector 308a and the charge pump 308b, the PFD-CP controller 530 outputs a PFD-CP on/off signal 320 for turning on the operation of the phase and frequency detector 308a and the charge pump 308b to the phase and frequency detector 308a and the charge pump 308b.

To turn off the operation of the phase and frequency detector 308a and the charge pump 308b, the PFD-CP controller 530 outputs the PFD-CP on/off signal 320 for turning off the operation of the phase and frequency detector 308a and the charge pump 308b to the phase and frequency detector 308a and the charge pump 308b.

The LF controller 540 outputs a control signal 319 for switching the control voltage 312 to be applied to the VCO 301 to the loop filter 310. The control signal 319 is a control signal for performing switching whether the voltage generated by the loop filter 310 according to the current or voltage 309 generated by the charge pump 308b is output as the control voltage 312 or the fixed voltage (for example, Vdd or Vdd/2) generated in the loop filter 310 by the loop filter 310 is output as the control voltage 312.

The reference signal 307 and the frequency-divided signal 306b obtained after the frequency division in the frequency divider 305 are input to the clock counter 550, and the clock counter 550 measures the frequencies of the reference signal 307 and the frequency-divided signal 306b. The output of the clock counter 550 is output to the VCO controller 510, the ILFD controller 520, the PFD-CP controller 530 and the LF controller 540.

For example, in the case that the frequency of the reference signal 307 is 100 MHz and that the frequency-divided signal 306a and the frequency-divided signal 306b have the same frequency, the clock counter 550 counts 110 clocks of the frequency-divided signal 306b while counting 100 clocks of the reference signal 307, whereby the frequency of the frequency-divided signal 306b becomes 110 MHz.

FIG. 3 is a block diagram showing the internal configuration of a wireless communication apparatus 1000 including the PLL circuit 300 according to the first embodiment. The wireless communication apparatus 1000 shown in FIG. 3 includes the reference signal oscillator BLO, the PLL circuit 300, a modulator 400, the transmission mixer 50a, the receiving mixer 50b, and a demodulator 500.

On the basis of the reference signal 307 generated by the reference signal oscillator BLO, the PLL circuit 300 outputs the first local signal having a desired frequency to the transmission mixer 50a and outputs the second local signal having a desired frequency to the receiving mixer 50b. The reference signal oscillator BLO can be configured using, for example, a crystal oscillator.

The baseband transmission signal (BB transmission signal) modulated by the modulator 400 and the first local signal generated by the PLL circuit 300 are input to the transmission mixer 50a, and the transmission mixer 50a up-converts the first local signal using the BB transmission signal, thereby generating a high-frequency transmission signal (RF transmission signal). The RF transmission signal is transmitted via a power amplifier and an antenna not shown in FIG. 3.

The high-frequency reception signal (RF reception signal) received via an antenna and a low-noise amplifier not shown in FIG. 3 and the second local signal generated by the PLL circuit 300 are input to the receiving mixer 50b, and the receiving mixer 50b down-converts the second local signal using the RF reception signal, thereby generating a baseband reception signal (BB reception signal) from the RF transmission signal. The BB reception signal is demodulated to the transmission signal being the same as that before the modulation.

(Calibration in the PLL Circuit According to the First Embodiment)

Figure 4:
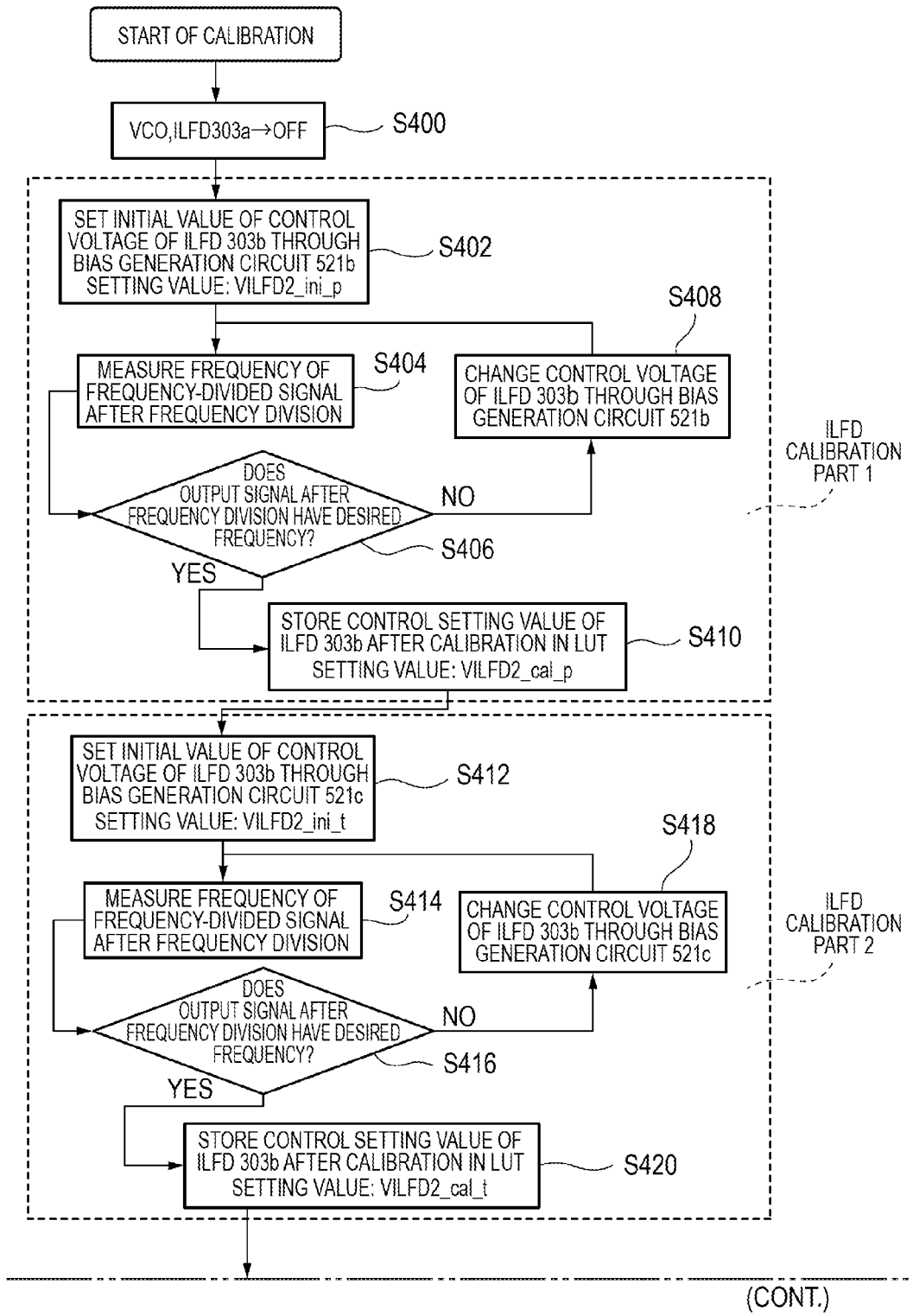
FIG. 4 is a flow chart illustrating a calibration operation procedure for the pre-stage ILFD, the post-stage ILFD and the VCO in the PLL circuit according to the first embodiment.

FIG. 4 is a flow chart illustrating a calibration operation procedure for the pre-stage ILFD 303a, the post-stage ILFD 303b and the VCO 301 in the PLL circuit 300 according to the first embodiment.

The flow chart shown in FIG. 4 includes ILFD calibration Part 1 for adjusting the control parameter (for example, the control voltage 313b) of the post-stage ILFD 303b, ILFD calibration Part 2 for adjusting the control parameter (for example, the control voltage 313b) of the post-stage ILFD 303b, ILFD calibration Part 3 for adjusting the control parameter (for example, the control voltage 313a) of the pre-stage ILFD 303a, and VCO calibration for selecting the oscillation band of the VCO 301.

More specifically, in ILFD calibration Part 1 shown at steps S402 to S410, the calibration circuit 314 calibrates the post-stage ILFD 303b, that is, adjusts the control parameter (for example, the control voltage 313b) of the post-stage ILFD 303b.

With respect to the variation in production or the fluctuation in ambient temperature at the post-stage ILFD 303b, the control parameter (for example, the control voltage 313b) obtained at step S410 is used to derive the initial value of the control parameter of the pre-stage ILFD 303a on the basis of the relative shift amount of the control parameter (for example, the control voltage 313b) from its initial value, that is, the difference value in the control parameter (for example, the control voltage 313b) before and after the adjustment.

In ILFD calibration Part 2 shown at steps S412 to S420, the calibration circuit 314 calibrates the post-stage ILFD 303b, that is, adjusts the control parameter (for example, the control voltage 313b) of the post-stage ILFD 303b.

The control parameter (for example, the control voltage 313b) obtained at step S420 is used in the case that the PLL circuit 300 shown in FIG. 1 locks, that is, operates as a frequency negative feedback circuit and generates the control voltage 312 of the VCO 301, thereby adjusting (correcting) the fluctuation in the output free-running frequency of the post-stage ILFD 303b with respect to the fluctuation in ambient temperature with time.

In ILFD calibration Part 3 shown at steps S450 to S460, the calibration circuit 314 calibrates the pre-stage ILFD 303a, that is, adjusts the control parameter (for example, the control voltage 313a) of the pre-stage ILFD 303a.

The control parameter (for example, the control voltage 313a) obtained at step S460 is used in the case that the PLL circuit 300 shown in FIG. 1 locks, that is, operates as a frequency negative feedback circuit, thereby adjusting (correcting) the fluctuation in the output free-running frequencies of the post-stage ILFD 303b with respect to the fluctuation in ambient temperature with time.

In VCO calibration shown at steps S480 to S486, the calibration circuit 314 calibrates the VCO 301, that is, selects the oscillation band of the VCO 301 for obtaining the high-frequency output signal 302 (the first local signal and the second local signal) having the desired frequency.

(ILFD Calibration Part 1)

First, detailed operations at steps S400 to S410 will be described.

In FIG. 2, the VCO controller 510 generates the VCO on/off signal 316 for turning off the operation of the VCO 301 and outputs the signal to the VCO 301. The ILFD controller 520 generates the ILFD on/off signal 322 for turning off the operation of the pre-stage ILFD 303a and outputs the signal to the pre-stage ILFD 303a (at S400). Hence, the operations of the VCO 301 and the pre-stage ILFD 303a are stopped.

Consequently, since no injection signal is input from the pre-stage ILFD 303a, the post-stage ILFD 303b does not operate as a frequency divider but operates as a voltage controlled oscillator, thereby generating an output free-running frequency signal.

The ILFD controller 520 generates a control signal 600a for turning on the operation of the bias generation circuit 521b and outputs the signal to the bias generation circuit 521b; furthermore, the ILFD controller 520 generates the selection signal 620 for selecting the control signal 610a generated by the bias generation circuit 521b and outputs the signal to the bias selection circuit 521d. The ILFD controller 520 outputs the initial value of the control parameter 630b for adjusting the output free-running frequency of the post-stage ILFD 303b to the bias generation circuit 521b.

The bias generation circuit 521b converts the initial value of the control parameter 630b output from the ILFD controller 520 into the control voltage 610a for adjusting the output free-running frequency of the post-stage ILFD 303b and outputs the voltage to the bias selection circuit 521d. According to the selection signal 620 generated by the ILFD controller 520, the bias selection circuit 521d outputs and applies the control voltage 610a generated by the bias generation circuit 521b as the control parameter (for example, the control voltage 313b) to the post-stage ILFD 303b (at S402). At step S402, the initial value of the control parameter (for example, the control voltage 313b) of the post-stage ILFD 303b is set to VILFD2_ini_p.

According to the control voltage 313b output and applied at step S402, the output free-running frequency signal generated by the post-stage ILFD 303b is frequency-divided by the frequency divider 305, and the frequency-divided signal 306b and the reference signal 307 are input to the clock counter 550.

The reference signal 307 and the frequency-divided signal 306b are input to the clock counter 550, and the clock counter 550 measures the frequencies of the reference signal 307 and the frequency-divided signal 306b (at S404).

In the case that the frequency of the frequency-divided signal 306b, that is, the frequency obtained by further frequency-dividing the output free-running frequency generated by the ILFD 303b using the frequency divider 305, is in the range of the preliminarily specified desired frequency (YES at S406), the processing of the calibration circuit 314 advances to step S410. in other words, in consideration of the frequency division ratio between the frequency-divided signal 306a and the frequency-divided signal 306b, in the case that the difference between the frequency of the reference signal 307 and the frequency of the frequency-divided signal 306b is a predetermined amount or less, the control voltage 313b of the post-stage ILFD 303b conforms to the desired operation condition in the PLL circuit 300, whereby no adjustment is necessary.

In the case that the frequency of the frequency-divided signal 306b is in the range of the preliminarily specified desired frequency (YES at S406), the ILFD controller 520 sets the control parameter 630b of the post-stage ILFD 303b to VILFD2_cal_p and stores the parameter in the lookup table 315 via the control line 321 (at step S410). Hence, the calibration (ILFD calibration Part 1) for the post-stage ILFD 303b in the calibration circuit 314 is completed.

On the other hand, in the case that the frequency of the frequency-divided signal 306b is not in the range of the preliminarily specified desired frequency (NO at S406), the processing of the calibration circuit 314 advances to step S408. In other words, on the basis of the measurement result of the clock counter 550, the ILFD controller 520 changes the control parameter 630b for adjusting the free-running frequency of the post-stage ILFD 303b to the desired frequency (at S408).

The ILFD controller 520 outputs the changed control parameter 630b to the bias generation circuit 521b. Hereafter, in a similar way, the bias generation circuit 521b converts the changed control parameter 630b into the control voltage 610a for adjusting the output free-running frequency of the post-stage ILFD 303b and outputs the voltage to the bias selection circuit 521d. According to the selection signal 620 generated by the ILFD controller 520, the bias selection circuit 521d outputs and applies the control voltage 610a generated by the bias generation circuit 521b as the control parameter (for example, the control voltage 313b) to the post-stage ILFD 303b.

The range of the desired frequency is herein, for example, the frequency of the reference signal 307±several % or less, and the same applies hereafter. For example, in the case that the frequency range (locking range) in which the post-stage ILFD 303b is operated as a frequency divider is 60 GHz±3 GHz, the specific operation band of the post-stage ILFD 303b is ±5%.

This means that the post-stage ILFD 303b normally operates as a frequency divider in the case that the deviation of the frequency input to the post-stage ILFD 303b is ±5% or less in the specific operation band. In the case that the frequency of the reference signal 307 is 100 MHz and that the frequency-divided signal 306a and the frequency-divided signal 306b have the same frequency division ratio, the post-stage ILFD 303b normally operates as a frequency divider in the case that the frequency of the frequency-divided signal 306b is 95 to 105 MHz.

According to the control voltage 313b output and applied at step S408, the output free-running frequency signal generated by the post-stage ILFD 303b is input to the post-stage ILFD 303b, and the frequency-divided signal 306b frequency-divided by the frequency divider 305 and the reference signal 307 are input to the clock counter 550.

After step S408, steps S404, S406 and S408 are repeated until the frequency of the frequency-divided signal 306b becomes in the range of the preliminarily specified desired frequency.

(ILFD Calibration Part 2)

Next, detailed operations at steps S412 to S420 will be described

The ILFD controller 520 generates a control signal 600b for turning on the operation of the bias generation circuit 521c and outputs the signal to the bias generation circuit 521c; furthermore, the ILFD controller 520 generates the selection signal 620 for selecting the control signal 610b generated by the bias generation circuit 521c and outputs the signal to the bias selection circuit 521d. The ILFD controller 520 outputs the initial value of the control parameter 630c for adjusting the output free-running frequency of the post-stage ILFD 303b to the bias generation circuit 521c.

The bias generation circuit 521c converts the initial value of the control parameter 630c output from the ILFD controller 520 into the control voltage 610b for adjusting the output free-running frequency of the post-stage ILFD 303b and outputs the voltage to the bias selection circuit 521d. According to the selection signal 620 generated by the ILFD controller 520, the bias selection circuit 521d outputs and applies the control voltage 610b generated by the bias generation circuit 521c as the control parameter (for example, the control voltage 313b) to the post-stage ILFD 303b (at S412). At step S412, the initial value of the control parameter 630c of the post-stage ILFD 303b is set to VILFD2_ini_t.

According to the control voltage 313b output and applied at step S412, the output free-running frequency signal generated by the post-stage ILFD 303b is frequency-divided by the frequency divider 305, and the frequency-divided signal 306b and the reference signal 307 are input to the clock counter 550.

The reference signal 307 and the frequency-divided signal 306b are input to the clock counter 550, and the clock counter 550 measures the frequencies of the reference signal 307 and the frequency-divided signal 306b (at S414).

In the case that the frequency of the frequency-divided signal 306b is in the range of the preliminarily specified desired frequency (YES at S416), the processing of the calibration circuit 314 advances to step S420. in other words, in consideration of the frequency division ratio between the frequency-divided signal 306a and the frequency-divided signal 306b, in the case that the difference between the frequency of the reference signal 307 and the frequency of the frequency-divided signal 306b is a predetermined amount or less, the control voltage 313b of the post-stage ILFD 303b conforms to the desired operation condition in the PLL circuit 300, whereby no adjustment is necessary.

In the case that the frequency of the frequency-divided signal 306b is in the range of the preliminarily specified desired frequency (YES at S416), the ILFD controller 520 sets the control parameter 630c of the post-stage ILFD 303b to VILFD2_cal_t and stores the parameter in the lookup table 315 via the control line 321 (at step S420). Hence, the calibration for the fluctuation in the ambient temperature of the post-stage ILFD 303b in the calibration circuit 314 is completed.

On the other hand, in the case that the frequency of the frequency-divided signal 306b is not in the range of the preliminarily specified desired frequency (NO at S416), the processing of the calibration circuit 314 advances to step S418. In other words, on the basis of the measurement result of the clock counter 550, the ILFD controller 520 changes the control parameter 630c for adjusting the output free-running frequency of the post-stage ILFD 303b to the desired frequency (at S418).

The ILFD controller 520 outputs the changed control parameter 630c to the bias generation circuit 521c. Hereafter, in a similar way, the bias generation circuit 521c converts the changed control parameter 630c into the control voltage 610b for adjusting the free-running frequency of the post-stage ILFD 303b and outputs the voltage to the bias selection circuit 521d. According to the selection signal 620 generated by the ILFD controller 520, the bias selection circuit 521d outputs and applies the control voltage 610b generated by the bias generation circuit 521c as the control parameter (for example, the control voltage 313b) to the post-stage ILFD 303b.

According to the control voltage 313b output and applied at step S418, the output free-running frequency signal generated by the post-stage ILFD 303b is input to the post-stage ILFD 303b, and the frequency-divided signal 306b frequency-divided by the frequency divider 305 and the reference signal 307 are input to the clock counter 550.

After step S418, steps S414, S416 and S418 are repeated until the frequency of the frequency-divided signal 306b becomes in the range of the preliminarily specified desired frequency.

(ILFD Calibration Part 3)

Next, detailed operations at steps S450 to S460 will be described.

The ILFD controller 520 outputs the ILFD on/off signal 322 for turning on the operation of the pre-stage ILFD 303a to the pre-stage ILFD 303a (at S450). Hence, since no injection signal is input from the VCO 301, the pre-stage ILFD 303a does not operate as a frequency divider but operates as a voltage controlled oscillator, thereby generating an output free-running frequency signal.

In the description of the following processing shown in FIG. 4, the control voltage 610b generated by the bias generation circuit 521c is used as the control voltage 313b to be applied and output to the post-stage ILFD 303b.

In the case that the post-stage ILFD 303b is injection-locked with the free-running frequency signal generated by the pre-stage ILFD 303a, the post-stage ILFD 303b operates as a frequency divider for frequency-dividing the free-running frequency signal generated by the pre-stage ILFD 303a. On the other hand, in the case that the post-stage ILFD 303b is not injection-locked with the free-running frequency signal generated by the pre-stage ILFD 303a, the post-stage ILFD 303b does not operate as a frequency divider but operates as a voltage controlled oscillator.

The ILFD controller 520 outputs the setting value of the control parameter 630a for adjusting the free-running frequency of the pre-stage ILFD 303a to the bias generation circuit 521a (at S452).

The setting value of the control parameter 630a at step S452 will be described herein specifically.

It is assumed that the initial value of the control parameter 630a of the pre-stage ILFD 303a to be stored in the lookup table 315 is VILFD1_ini. As the setting value of the control parameter 630a of the pre-stage ILFD 303a, the ILFD controller 520 sets the result of the addition of the initial value VILFD1_ini plus the result of the multiplication of the difference value ΔVILFD2 in the control voltage 313b of the post-stage ILFD 303b before and after the adjustment by a predetermined adjustment coefficient k plus a constant α (refer to Mathematical Expression (1)).

[Mathematical Expression 1]

$$VILFD1\_ini + k\Delta VILFD2 + \alpha \quad (1)$$

In Mathematical Expression (1), k is an adjustment coefficient of 0.95 to 1.05, for example. The constant α is an adjustment coefficient of 0.1 to 0.3, for example. Furthermore, in Mathematical Expression (1), ΔVILFD2= (VILFD2_cal_p)−(VILFD2_ini_p). In other words, ΔVILFD2 is a difference value in the control parameter 630c of the post-stage ILFD 303b before and after the adjustment in ILFD calibration Part 2 at steps S412 to S420.

In the case that the ILFDs 303a and 303b have the same circuit configuration, it is assumed that the correction values of the control voltages of the ILFDs 303a and 303b in correspondence with fluctuation in characteristics due to variation in production and fluctuation in supply power source voltage or ambient temperature are nearly the same.

In the ILFD controller 520, it is assumed that the setting value of the control parameter 630a for adjusting the output free-running frequency of the pre-stage ILFD 303a is the setting value indicated by Mathematical Expression (1). Hence, the free-running frequency of the signal generated by the pre-stage ILFD 303a is in the locking range of the post-stage ILFD 303b, whereby the post-stage ILFD 303b can frequency-divide the free-running frequency signal generated by the pre-stage ILFD 303a. The ILFD controller 520 can set the control voltage of the pre-stage ILFD 303a in the range from V1ref(L) to V1ref(H) shown in FIG. 16.

The bias generation circuit 521a converts the setting value of the control parameter 630a output from the ILFD controller 520 into the control voltage 313a for adjusting the output free-running frequency of the pre-stage ILFD 303a, and outputs and applies the voltage to the pre-stage ILFD 303a (at S452).

According to the control voltage 313a output and applied at step S452, the free-running frequency signal generated by the pre-stage ILFD 303a is input to the post-stage ILFD 303b, and the frequency-divided signal 306b frequency-divided by the frequency divider 305 and the reference signal 307 are input to the clock counter 550.

The reference signal 307 and the frequency-divided signal 306b are input to the clock counter 550, and the clock counter 550 measures the frequencies of the reference signal 307 and the frequency-divided signal 306b (at S454).

In the case that the frequency of the frequency-divided signal 306b is in the range of the preliminarily specified desired frequency (YES at S456), the processing of the calibration circuit 314 advances to step S460. in other words, in consideration of the frequency division ratio between the frequency-divided signal 306a and the frequency-divided signal 306b, in the case that the difference between the frequency of the reference signal 307 and the frequency of the frequency-divided signal 306b is a predetermined amount or less, the control voltage 313a of the pre-stage ILFD 303a conforms to the desired operation condition in the PLL circuit 300, whereby no adjustment is necessary.

The ILFD controller 520 sets the control parameter 630a of the pre-stage ILFD 303a to VILFD1_cal and stores the parameter in the lookup table 315 via the control line 321 (at step S460). Hence, the calibration for the pre-stage ILFD 303a in the calibration circuit 314 in correspondence with fluctuation in ambient temperature is completed.

On the other hand, in the case that the frequency of the frequency-divided signal 306b is not in the range of the preliminarily specified desired frequency (NO at S456), the processing of the calibration circuit 314 advances to step S458. In other words, on the basis of the measurement result of the clock counter 550, the ILFD controller 520 changes the control parameter 630a for adjusting the output free-running frequency of the pre-stage ILFD 303a to the desired frequency (at S458).

The ILFD controller 520 outputs the changed control parameter 630a to the bias generation circuit 521a. Hereafter, in a similar way, the bias generation circuit 521a outputs and applies the changed control parameter 630a as the control voltage 313a to the pre-stage ILFD 303b.

According to the control voltage 313a output and applied at step S458, the free-running frequency signal generated by the pre-stage ILFD 303a is input to the pre-stage ILFD 303a and the post-stage ILFD 303b, and the frequency-divided signal 306b frequency-divided by the frequency divider 305 and the reference signal 307 are input to the clock counter 550.

After step S458, steps S454, S456 and S458 are repeated until the frequency of the frequency-divided signal 306b becomes in the range of the preliminarily specified desired frequency.

(VCO Calibration)

Detailed operations at steps S480 to S486 will be described.

After step S460, the VCO controller 510 generates the VCO on/off signal 316 for turning on the operation of the VCO 301 having been stopped during the calibration for the respective control voltages of the post-stage ILFD 303b and the pre-stage ILFD 303a and outputs the signal to the VCO 301 (at S480). Hence, the VCO 301 starts operation.

Consequently, the pre-stage ILFD 303a is injection-locked with the high-frequency output signal 302 generated by the VCO 301 and operates as a frequency divider for frequency-dividing the high-frequency output signal 302.

The LF controller 540 outputs the control signal 319 for switching the control voltage 312 serving as the output of the loop filter 310, that is, the control signal 319 for outputting the fixed value (for example, Vdd or Vdd/2) generated in the loop filter 310 by the loop filter 310 as the control voltage 312 to the loop filter 310 (at S482).

Furthermore, the VCO controller 510 outputs the band selection signal 311 for selecting the oscillation band for determining the oscillation frequency characteristics of the VCO 301 according to the control voltage 312 serving as the output of the loop filter 310 to the VCO 301 (at S482).

The VCO 301 outputs the high-frequency output signal 302 having the oscillation frequency according to the control voltage 312 to the pre-stage ILFD 303a according to the oscillation band corresponding to the band selection signal 311 output from the VCO controller 510.

On the basis of the control voltage 313a according to the control parameter 630a stored at step S460, the pre-stage ILFD 303a is injection-locked with the high-frequency output signal 302 generated by the VCO 301 and frequency-divides the high-frequency output signal 302 up to a predetermined number of times. The pre-stage ILFD 303a outputs the frequency-divided signal 303 obtained after the frequency division to the post-stage ILFD 303b.

On the basis of the control voltage 313b generated according to the control parameter 630b stored at step S420, the post-stage ILFD 303b is injection-locked with the frequency-divided signal 303 obtained after the frequency division by the pre-stage ILFD 303a and frequency-divides the frequency-divided signal 303 up to a predetermined number of times. The post-stage ILFD 303b outputs the frequency-divided signal 304 obtained after the frequency division to the frequency divider 305.

The frequency divider 305 frequency-divides the frequency-divided signal 304 obtained after the frequency division by the post-stage ILFD 303b up to a predetermined number of times, outputs the frequency-divided signal 306a obtained after the frequency division to the phase and frequency detector 308a, and further outputs the frequency-divided signal 306b obtained after the frequency division to the clock counter 550.

The reference signal 307 and the frequency-divided signal 306b are input to the clock counter 550, and the clock counter 550 measures the frequencies of the reference signal 307 and the frequency-divided signal 306b. The clock counter 550 measures the frequencies of the reference signal 307 and the frequency-divided signal 306b for all the oscillation bands of the VCO 301 (at S482).

On the basis of the frequencies of all the oscillation bands measured at step S482, the VCO controller 510 detects the oscillation bands in which the pre-stage ILFD 303a and the post-stage ILFD 303b operate in the respective locking ranges (at S484).

The VCO controller 510 stores, as one of the oscillation bands detected at step S484, the oscillation band in which the frequency of the frequency-divided signal 306 is best suited to the desired frequency in the lookup table 315 via the control line 321 (at step S486).

After step S486, the LF controller 540 releases the output of the control signal 319 for outputting the fixed value generated in the loop filter 310 by the loop filter 310 as the control voltage 312.

In addition, the LF controller 540 outputs, to the loop filter 310, the control signal 319 for outputting the constant voltage generated by the loop filter 310 as the control voltage 312 according to the current or voltage 309 generated by the charge pump 308b. Hence, the calibration for the VCO 301 by the calibration circuit 314 is completed.

Consequently, even in the case that conditions including variation in production process (variation in production), power source voltage or ambient temperature have changed in the PLL circuit 300 according to this embodiment, the plurality of ILFDs 303a and 303b can operate in the respective locking ranges, and the desired frequency can be obtained stably by appropriately setting the oscillation band of the VCO 301.

Furthermore, in the ILFD controller 520, the difference value in the control voltage of the post-stage ILFD 303b before and after the adjustment is included in the initial set value of the control voltage of the pre-stage ILFD 303a, whereby the initial operation of the pre-stage ILFD 303a is made possible in the locking range of the post-stage ILFD 303b. Hence, in the PLL circuit 300, the adjustment amount of the control voltage 313a of the pre-stage ILFD 303a can be made small, and the calibration can be completed in a short time.

Moreover, the PLL circuit 300 uses the bias generation circuits 521a and 521c capable of suppressing the temperature fluctuation of the respective pre-stage ILFD 303a and post-stage ILFD 303b, and for the calibration, the PLL circuit 300 uses the bias generation circuit 521b different from the bias selection circuits described above, whereby the calibration can be performed accurately and the PLL circuit 300 can operate stably.

What's more, in the case that the LF controller 540 supplies the fixed value generated by the loop filter 310 as the control voltage 312 serving as the output of the loop filter 310 and in the case that the operation of the VCO 301 is stopped, the PFD-CP controller 530 may output the PFD-CP on/off signal 320 for turning off the operations of the phase and frequency detector 308a and the charge pump 308b to the phase and frequency detector 308a and the charge pump 308b.

As a result, in the PLL circuit 300, the power consumption in the PLL circuit 300 can be reduced at steps S400 to S486 shown in FIG. 4.

(Second Measurement)

In a second embodiment, the PLL circuit 300 performs calibration in which the sequence of ILFD calibration Part 1 and ILFD calibration Part 2 in the PLL circuit 300 according to the first embodiment is reversed.

Figure 5:
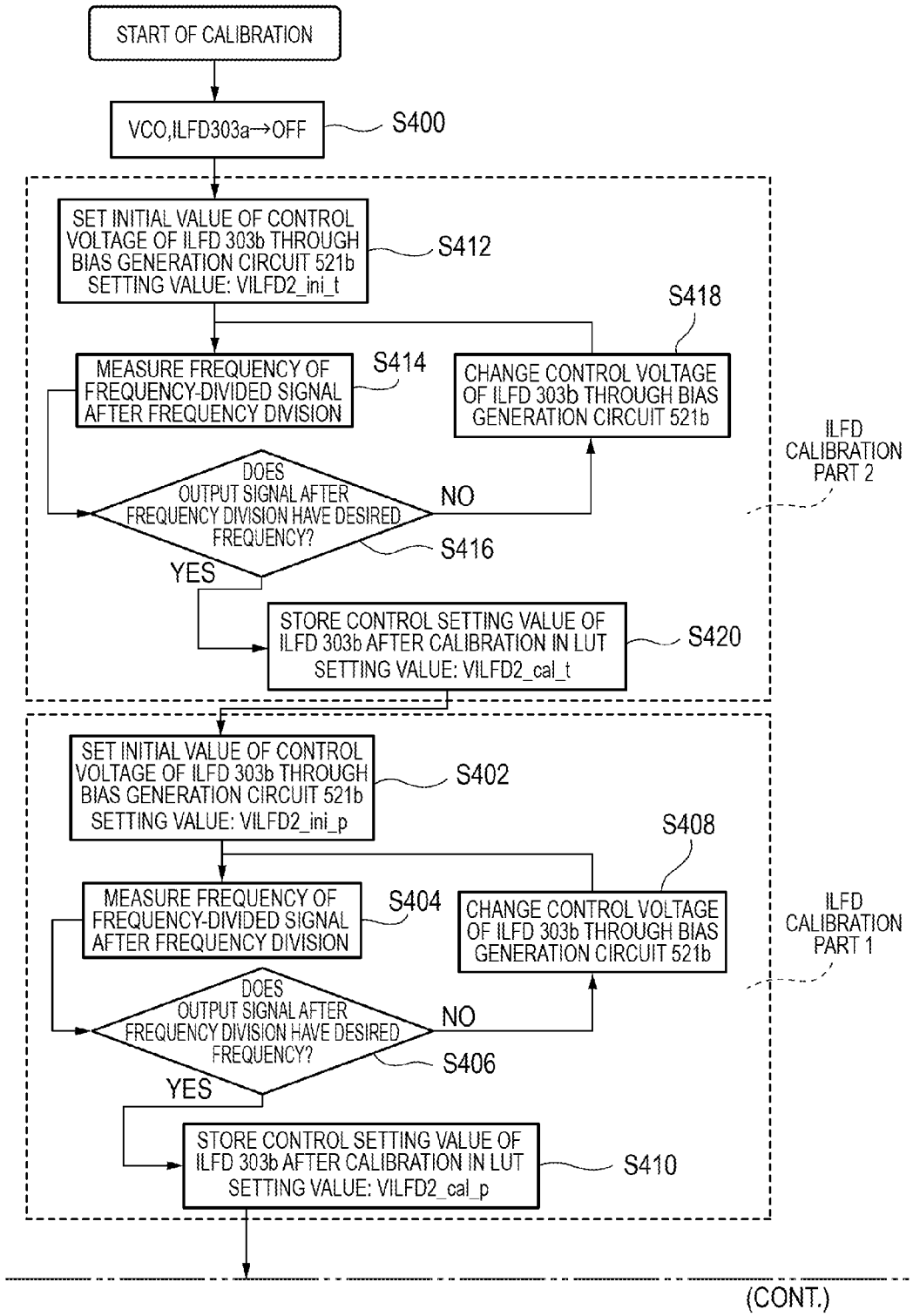
FIG. 5 is a flow chart illustrating a calibration operation procedure for the ILFDs and the VCO in the PLL circuit according to a second embodiment.

FIG. 5 is a flow chart illustrating a calibration operation procedure for the ILFDs and the VCO in the PLL circuit according to the second embodiment. In the description of the second embodiment, the configuration of the PLL circuit 300 shown in FIG. 1 and the configuration of the calibration circuit 314 shown in FIG. 2 are used, the contents of the configurations and operations of the respective sections thereof and the descriptions of the same portions thereof are omitted or simplified, and contents different from the first embodiment will be described.

(Calibration in the PLL Circuit According to the Second Embodiment)

(ILFD Calibration)

In FIG. 5, after step S400, the contents of an operation procedure for setting the control voltage 313b of the post-stage ILFD 303b at steps S412 to S420 are the same as the contents at steps S412 to S420 in FIG. 4, whereby the descriptions thereof are omitted.

In FIG. 5, after step S420, the contents of an operation procedure for setting the control voltage 313b of the post-stage ILFD 303b at steps S402 to S410 are the same as the contents at steps S402 to S410 in FIG. 4, whereby the descriptions thereof are omitted.

In FIG. 5, after step S410, the contents of an operation procedure for setting the control voltage 313a of the pre-stage ILFD 303a at steps S450 to S460 are the same as the contents in steps S450 to S460 in FIG. 4, whereby the descriptions thereof are omitted.

The flow charts shown in FIGS. 4 and 5 are different from each other in that the sequence of ILFD calibration Part 1 at steps S402 to S410 and ILFD calibration Part 2 at steps S412 to S420 is reversed.

At step S452, the calibration circuit 314 uses the setting value VILFD2_cal_p of the control voltage 313b set at step S410 and the initial value VILFD2_ini_p of the control parameter 630b set at step S402.

(VCO Calibration)

In FIG. 5, after step S460, an operation procedure for performing the calibration for the VCO 301 at steps S480 to S486, that is, for selecting the oscillation band of the VCO 301 for obtaining the output signal (the first local signal and the second local signal) having the desired frequency, is the same as the procedure at steps S48 to S486 in FIG. 4, whereby the descriptions thereof are omitted.

In FIG. 5, the control voltage 313b of the injection locked frequency divider 303b is the value obtained at step S410; however, the value is preferably changed to the value obtained at step S420 in the processing between step S480 to step S486.

As described above, in the PLL circuit 300 according to this embodiment, the calibration is performed by reversing the sequence of ILFD calibration Part 1 and ILFD calibration Part 2 in the PLL circuit 300 according to the first embodiment.

Even in the case that the sequence of ILFD calibration Part 1 and ILFD calibration Part 2 in the PLL circuit 300 according to the first embodiment is reversed, the initial value of the control voltage 313a of the pre-stage ILFD 303a, which is used for ILFD calibration Part 3 at step S452, can be set in the PLL circuit 300.

Consequently, the PLL circuit 300 according to this embodiment can obtain advantages similar to those offered by the PLL circuit 300 according to the first embodiment.

Although various embodiments have been described above referring to the drawings, it is needless to say that the present disclosure is not limited to the embodiments. It is obvious that those skilled in the art can devise various alterations or modifications within the scope set forth in the claims, and it is understood that these belong to the technical scope of the present disclosure as a matter of course.

In the above-mentioned respective embodiments, to stop the operation of the VCO 301, the VCO controller 510 outputs the VCO on/off signal 316 for stopping the operation of the VCO 301 to the VCO 301.

It may be possible that, for example, to stop the operation of the VCO 301, a switch is provided between the VCO 301 and the pre-stage ILFD 303a and that the VCO controller 510 outputs the VCO on/off signal 316 to the switch. With this configuration, the switch breaks the connection between the VCO 301 and the pre-stage ILFD 303a. In other words, the high-frequency output signal 302 generated by the VCO 301 is not input to the pre-stage ILFD 303a, whereby this state becomes substantially the same as the state in which the operation of the VCO 301 is stopped.

The present application is based on Japanese Patent Application (JP-A-2013-088849) filed on Apr. 19, 2013, the contents of which are hereby incorporated by reference.

INDUSTRIAL APPLICABILITY

The present disclosure is useful as a PLL circuit, a calibration method and a wireless communication apparatus capable of obtaining a desired frequency by operating a plurality of cascade-connected injection locked frequency dividers in their respective locking ranges.

DESCRIPTION OF REFERENCE NUMERALS AND SIGNS 50a transmission mixer
50b receiving mixer
300 PLL circuit
301 voltage controlled oscillator
303a, 303b injection locked frequency divider
305 frequency divider
308a phase and frequency detector
308b charge pump
310 loop filter
314 calibration circuit
315 lookup table
400 modulator
500 demodulator
510 VCO controller
520 ILFD controller
521a, 521b, 521c bias generation circuit
521d bias selection circuit
530 PFD-CP controller
540 LF controller
550 clock counter
1000 wireless communication terminal

The invention claimed is:
1. A PLL circuit comprising:
a voltage controlled oscillator that outputs a high-frequency signal;
a first injection locked frequency divider that generates a first frequency-divided signal obtained by frequency-dividing the output high-frequency signal;
a second injection locked frequency divider that generates a second frequency-divided signal obtained by frequency-dividing the first frequency-divided signal;
a frequency divider that generates a third frequency-divided signal obtained by frequency-dividing the second frequency-divided signal so as to be a frequency of a reference signal;
a phase and frequency comparator that compares the third frequency-divided signal with the reference signal and that outputs the difference between phase and frequency;
a charge pump that converts the output difference into current or voltage;

a loop filter that generates the control voltage of the voltage controlled oscillator according to the converted current or voltage and that applies the generated control voltage to the voltage controlled oscillator; and a calibration circuit that selects an oscillation band for determining the oscillation frequency of the voltage controlled oscillator, and that adjusts a first control parameter of the first injection locked frequency divider and a second control parameter of the second injection locked frequency divider, for operating the first injection locked frequency divider and the second injection locked frequency divider at different operation bands, wherein after adjusting the second control parameter, the calibration circuit adjusts the first control parameter, and adjusts the oscillation band of the voltage controlled oscillator according to the third frequency-divided signal.

2. The PLL circuit according to claim 1, wherein the calibration circuit further includes a first bias generation circuit that generates the first control parameter to be used for the frequency division of the high-frequency signal in correspondence with fluctuation in temperature.

3. The PLL circuit according to claim 1, wherein the calibration circuit further includes:
a clock counter that measures the frequencies of the third frequency-divided signal and the reference signal; and
a first bias generation circuit that generates the first control parameter to be used for the frequency division of the high-frequency signal in correspondence with fluctuation in temperature and to be used for adjusting the measured frequency of the second frequency-divided signal.

4. The PLL circuit according to claim 3, wherein as a setting value of the first control parameter, the calibration circuit uses a result of the addition of an initial value of the first control parameter, a value related to the second control parameter, and a constant,
wherein the first control parameter is generated in correspondence with fluctuation in temperature; and
wherein the value related to the second control parameter is a value obtained by the multiplication of the difference between the second control parameter after the adjustment and the second control parameter before the adjustment by a constant coefficient.

5. The PLL circuit according to claim 1, wherein the calibration circuit further includes:
a second bias generation circuit that generates a control parameter to be used as the second control parameter for the frequency division of the first frequency-divided signal;
a third bias generation circuit that generates a control parameter to be used as the second control parameter for the frequency division of the first frequency-divided signal in correspondence with fluctuation in temperature in correspondence with fluctuation in temperature with time; and
a bias selection circuit that selects the second control parameter generated by the second bias generation circuit or the second control parameter generated by the third bias generation circuit.

6. The PLL circuit according to claim 5, wherein as a setting value of the first control parameter, the calibration circuit uses a result of the addition of an initial value of the first control parameter, a value related to the second control parameter, and a constant,
wherein the first control parameter is generated in correspondence with fluctuation in temperature; and wherein the value related to the second control parameter is a value obtained by the multiplication of the difference between the second control parameter after the adjustment and the second control parameter before the adjustment by a constant coefficient.

7. The PLL circuit according to claim 1, wherein the calibration circuit further includes:
a clock counter that measures the frequencies of the third frequency-divided signal frequency-divided according to the control parameter of the second injection locked frequency divider and the reference signal;
a second bias generation circuit that generates a control parameter to be used as the second control parameter for the frequency division of the first frequency-divided signal and to be used for adjusting the measured frequency of the second frequency-divided signal;
a third bias generation circuit that generates a control parameter to be used as the second control parameter for the frequency division of the first frequency-divided signal in correspondence with fluctuation in temperature and to be used for adjusting the measured frequency of the second frequency-divided signal; and
a bias selection circuit that selects the second control parameter generated by the second bias generation circuit or the second control parameter generated by the third bias generation circuit.

8. The PLL circuit according to claim 1, wherein the calibration circuit further includes:
a VCO controller that controls an operation of the voltage controlled oscillator; and
an ILFD controller that controls operations of the first injection locked frequency divider and the second injection locked frequency divider; and
wherein the ILFD controller stops the voltage controlled oscillator in the case that the ILFD controller adjusts the first control parameter and the second control parameter.

9. The PLL circuit according to claim 8, wherein the VCO controller releases the stop of the voltage controlled oscillator after the adjustment of the first control parameter and selects the oscillation band for determining the oscillation frequency of the voltage controlled oscillator.

10. The PLL circuit according to claim 8, wherein according to the frequency differences between the reference signal and the frequency-divided signals obtained by frequency-dividing the high-frequency signal from the voltage controlled oscillator according to the selected oscillation band by the first injection locked frequency divider, by the second injection locked frequency divider and by the frequency divider, the VCO controller selects another oscillation band of the voltage controlled oscillator.

11. A wireless communication apparatus comprising:
the PLL circuit according to claim 1;
a modulator that modulates a baseband transmission signal;
a transmission mixer that generates a high-frequency signal using the first local signal generated by the PLL circuit and the modulated transmission signal;
a receiving mixer that generates a baseband reception signal using the second local signal generated by the PLL circuit and a received high-frequency reception signal; and
a demodulator that demodulates the generated baseband reception signal.

12. A calibration method in a PLL circuit in which a first injection locked frequency divider is connected to a second injection locked frequency divider, the calibration method comprising the steps of:
- stopping operations of a voltage controlled oscillator for outputting a high-frequency signal and the first injection locked frequency divider;
- measuring frequencies of a predetermined reference signal and the frequency-divided signal output from a frequency divider for frequency-dividing an output signal of the second injection locked frequency divider according to a second control parameter of the second injection locked frequency divider;
- adjusting the second control parameter on the basis of the measured frequency of the frequency-divided signal;
- releasing the stop of the first injection locked frequency divider;
- frequency-dividing the output signal of the first injection locked frequency divider by the second injection locked frequency divider according to the first control parameter of the first injection locked frequency divider;
- measuring the frequencies of the predetermined reference signal and a frequency-divided signal output from the frequency divider again, the frequency divider frequency-dividing the output signal of the second injection locked frequency divider;
- adjusting the first control parameter on the basis of the frequency of the frequency divided signal output after the re-measurement;
- releasing the stop of the voltage controlled oscillator;
- selecting an oscillation band for determining the oscillation frequency of the voltage controlled oscillator; and
- selecting the oscillation band of the voltage controlled oscillator on the basis of the frequencies of the frequency-divided signals obtained by frequency-dividing the output signal of the voltage controlled oscillator according to the selected oscillation band by the first injection locked frequency divider, by the second injection locked frequency divider and by the frequency divider.

* * * * *